US011121155B2

(12) United States Patent
Do et al.

(10) Patent No.: US 11,121,155 B2
(45) Date of Patent: Sep. 14, 2021

(54) INTEGRATED CIRCUIT INCLUDING MULTIPLE HEIGHT CELL AND METHOD OF FABRICATING THE INTEGRATED CIRCUIT

(71) Applicant: Samsung Electronics Co., Ltd., Suwon-si (KR)

(72) Inventors: Jung-ho Do, Hwaseong-si (KR); Ji-su Yu, Seoul (KR); Hyeon-gyu You, Jeollabuk-do (KR); Seung-young Lee, Seoul (KR); Jae-boong Lee, Yongin-si (KR)

(73) Assignee: Samsung Electronics Co., Ltd.

( * ) Notice: Subject to any disclaimer, the term of this patent is extended or adjusted under 35 U.S.C. 154(b) by 112 days.

(21) Appl. No.: 16/292,433

(22) Filed: Mar. 5, 2019

(65) Prior Publication Data

US 2019/0355749 A1    Nov. 21, 2019

(30) Foreign Application Priority Data

May 18, 2018    (KR) .................. 10-2018-0057324

(51) Int. Cl.
*H01L 27/118*    (2006.01)
*H01L 23/52*    (2006.01)
*H01L 21/82*    (2006.01)
*H01L 27/02*    (2006.01)
*G06F 30/39*    (2020.01)

(52) U.S. Cl.
CPC ........ *H01L 27/11807* (2013.01); *G06F 30/39* (2020.01); *H01L 27/0207* (2013.01); *H01L 2027/11866* (2013.01); *H01L 2027/11875* (2013.01); *H01L 2027/11881* (2013.01); *H01L 2027/11887* (2013.01)

(58) Field of Classification Search
CPC ............... G06F 30/39; H01L 27/11807; H01L 27/0207; H01L 27/11529; H01L 27/11524
See application file for complete search history.

(56) References Cited

U.S. PATENT DOCUMENTS

| 6,838,713 | B1  | 1/2005  | Gheewala et al. |
| 7,564,077 | B2* | 7/2009  | Ko ................... H01L 27/11807 257/206 |
| 8,255,837 | B2  | 8/2012  | Lu et al. |
| 8,513,978 | B2  | 8/2013  | Sherlekar |
| 8,631,377 | B2  | 1/2014  | Lee et al. |
| 8,946,914 | B2  | 2/2015  | Stephens et al. |
| 9,026,977 | B2  | 5/2015  | Tarabbia et al. |
| 9,147,028 | B2  | 9/2015  | Rashed et al. |
| 9,189,586 | B2  | 11/2015 | Suzuki et al. |
| 9,431,300 | B1  | 8/2016  | Zeng et al. |
| 9,911,697 | B2  | 3/2018  | Chen et al. |
| 10,380,315 | B2* | 8/2019 | Zhuang ............... H01L 27/0207 |

(Continued)

*Primary Examiner* — Alonzo Chambliss
(74) *Attorney, Agent, or Firm* — Myers Bigel, P.A.

(57) ABSTRACT

An integrated circuit includes a first cell arranged in a first row extending in a first horizontal direction, a second cell arranged in a second row adjacent to the first row, and a third cell continuously arranged in the first row and the second row. The first cell and the second cell comprise respective portions of a first power line extending in the first horizontal direction, and the third cell includes a second power line electrically connected to the first power line and extending in the first horizontal direction in the first row.

16 Claims, 21 Drawing Sheets

(56) References Cited

U.S. PATENT DOCUMENTS

| | | | |
|---|---|---|---|
| 10,867,114 B2* | 12/2020 | Zhuang | G06F 30/392 |
| 2007/0290270 A1* | 12/2007 | Ko | G06F 30/392 |
| | | | 257/369 |
| 2008/0169487 A1 | 7/2008 | Shimbo et al. | |
| 2015/0213183 A1* | 7/2015 | Lee | G06F 30/392 |
| | | | 716/119 |
| 2017/0365594 A1 | 12/2017 | Yang | |
| 2017/0371995 A1 | 12/2017 | Correale, Jr. et al. | |
| 2019/0148407 A1* | 5/2019 | Guo | H01L 29/6681 |
| | | | 257/206 |

* cited by examiner

INTEGRATED CIRCUIT INCLUDING MULTIPLE HEIGHT CELL AND METHOD OF FABRICATING THE INTEGRATED CIRCUIT

CROSS-REFERENCE TO RELATED APPLICATION

This application claims the benefit of Korean Patent Application No. 10-2018-0057324, filed on May 18, 2018, in the Korean Intellectual Property Office, the disclosure of which is incorporated herein in its entirety by reference.

BACKGROUND

The inventive concepts relate to integrated circuits, and more particularly, to integrated circuits including a multiple height cell and methods of fabricating the integrated circuits.

Sizes of cells included in an integrated circuit may be reduced to improve a degree of integration of the integrated circuit. A drive current capability of the cells may be reduced due to the reduced sizes of the cells, and thus various types of cells having different areas while maintaining or otherwise providing the same drive current capability may be included in the integrated circuit. In addition, the reduced sizes of the cells may increase routing difficulty inside the cells, and cells that have a more complicated structure may have extended areas that may be required by the routing.

SUMMARY

The inventive concepts provide an integrated circuit including multiple height cells, and more particularly, an integrated circuit including multiple height cells which provide higher efficiency by having a structure that is independent of the structure of a single height cell, and methods of fabricating the integrated circuit.

According to an aspect of the inventive concepts, there is provided an integrated circuit including: a first cell arranged in a first row extending in a first horizontal direction; a second cell arranged in a second row adjacent to the first row; and a third cell continuously arranged in the first row and the second row, wherein the first cell and the second cell share or comprise respective portions of a first power line extending in the first horizontal direction, and the third cell includes a second power line electrically connected to the first power line and extending in the first horizontal direction in the first row. The second row may be free of the second power line.

According to another aspect of the inventive concepts, there is provided an integrated circuit including: a first cell arranged in a first row extending in a first horizontal direction; a second cell arranged in a second row adjacent to the first row; and a third cell continuously arranged in the first row and the second row, wherein the third cell includes a first active region and a second active region extending parallel to each other in the first horizontal direction and of a first conductivity type and a second conductivity type, respectively, wherein the first active region includes at least a portion arranged in the first row and the second active region includes at least a portion arranged in the second row.

According to another aspect of the inventive concepts, there is provided an integrated circuit including: a single height cell arranged in a first row extending in a first horizontal direction and including a first active region extending in the first horizontal direction, the single height cell of a first conductivity type; and a multiple height cell continuously arranged in the first row and a second row adjacent to the first row, the multiple height cell including a second active region extending in the first horizontal direction and of a second conductivity type, wherein the first active region includes a portion thereof opposite the second active region in the first horizontal direction.

BRIEF DESCRIPTION OF THE DRAWINGS

The drawings attached hereto are not to scale for convenience of illustration and may be exaggerated or reduced in size. Embodiments of the inventive concepts will be more clearly understood from the following detailed description taken in conjunction with the accompanying drawings in which.

DETAILED DESCRIPTION OF EMBODIMENTS

Figure 1:
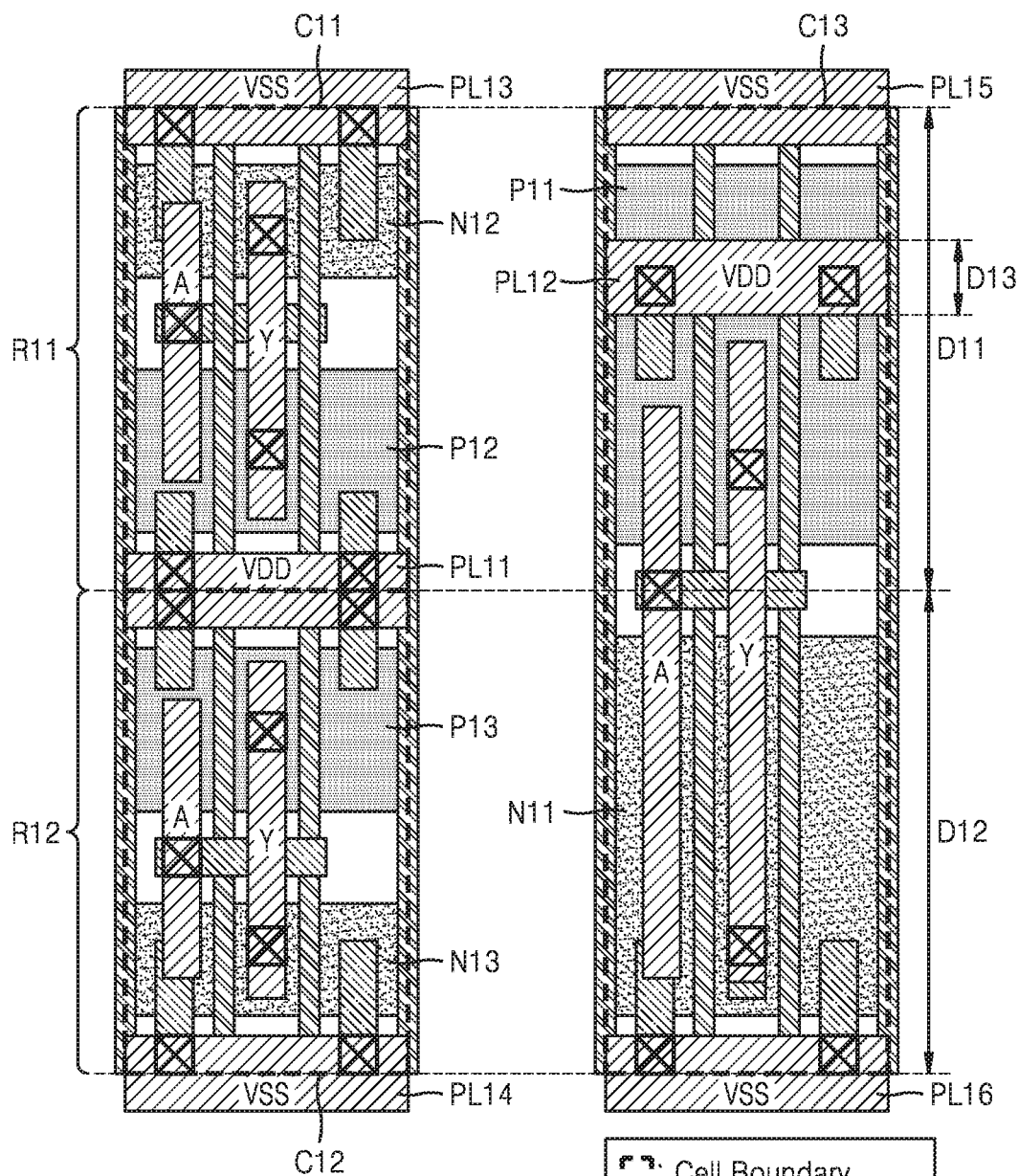
FIG. 1 illustrates plan views of cells according to some embodiments.

FIG. 1 illustrates plan views of a first cell C11, a second cell C12, and a third cell C13 according to some embodiments. The terms first, second, third, etc. are used herein merely to distinguish or differentiate one element from another. FIG. 1 illustrates a layout of an integrated circuit including the first and second cells C11 and C12, which are single height cells, arranged in a first row R11 and a second row R12, respectively, and the third cell C13, which is a multiple height cell, arranged continuously in the first row R11 and the second row R12. The X-axis direction and the Y-axis direction may be referred to as a first horizontal direction and a second horizontal direction, respectively, and the Z-axis direction may be referred to as a vertical direction. A plane formed by the X-axis and the Y-axis may be referred to as a horizontal plane, a component arranged in the (+) Z-axis direction relative to another component may be referred to as being above or over the other component, and a component arranged in the (−) Z-axis direction relative to another component may be referred to as being below or under the other component. Unless otherwise specified herein, a height of the component may refer to a length of the component in the Y-axis direction, and a width of the component may refer to a length of the component in the X-axis direction. In addition, an area of the component may refer to a size occupied by the component on a plane parallel to the horizontal plane (e.g., a footprint of the component). In the drawings herein, only some of layers may be illustrated for convenience of illustration, and vias may be illustrated despite being located under a pattern of a metal layer for convenience of understanding.

A cell may be a unit of the layout included in the integrated circuit, and may be referred to as a standard cell. The integrated circuit may include a number of various cells. The cell may have a structure according to a certain standard and may be arranged in a plurality of rows. For example, as illustrated in FIG. 1, the first cell C11 may be arranged in a first row R11 extending in the X-axis direction, and the second cell C12 may be arranged in the second row R12. A first height D11 of the first row R11 and a second height D12 of the second row R12 may be identical, and the first and second cells C11 and C12 may have an identical height (either the first height D11 or the second height D12). As such, a cell which has a height equal to a height of a row such that the cell is arranged in one row may be referred to as the single height cell.

Referring to FIG. 1, the third cell C13 may be continuously arranged in the first row R11 and the second row R12. In some embodiments, cells that are continuously arranged in multiple rows (e.g., the first and second rows R11 and R12) may refer to cells that continuously extend into regions corresponding to the multiple rows. Accordingly, as shown in FIG. 1, the third cell C13 may have a height equal to a sum of the first height D11 of the first row R11 and the second height D12 of the second row R12. As such, a cell continuously arranged in two or more consecutive rows may be referred to as a multiple height cell, and in particular, a cell which is consecutively arranged in two adjacent rows may be referred to as a double height cell. In other words, the multiple height cell may have a height identical to a multiple of a height of a single row (or a height of the single height cell). The multiple height cell may be used for various purposes. For example, the multiple height cell may be used to implement a structure in which routing signals by extending in the X-axis direction is not easy, or may be used as a decap, a filler, etc. Hereinafter, embodiments of the inventive concepts will be described primarily with reference to a dual or double height cell arranged in two consecutive rows such as the third cell C13 in FIG. 1, but it will be understood that some embodiments may also be applied to a multiple height cell sequentially arranged in three or more consecutive rows.

The first, second, and third cells C11, C12, and C13 may include active regions and fins extending in the X-axis direction, and may include gate lines extending in the Y-axis direction. In some embodiments, an active region may include a semiconductor such as silicon (Si) or germanium (Ge), or a compound semiconductor such as silicon germanium (SiGe), silicon carbide (SiC), gallium arsenide (GaAs), indium arsenide (InAs), and/or indium phosphide (InP), and a conductive region such as a well doped with impurities or a structure doped with impurities. In some embodiments, a gate line may include a work function metal-containing layer and/or a gap-fill metal layer. For example, the work function metal-containing layer may include titanium (Ti), tungsten (W), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), and/or palladium (Pd), and the gap-fill metal layer may include a W layer or an aluminum (Al) layer. In some embodiments, the gate lines may include a stacked structure of TiAlC/TiN/W, where N is nitrogen, a stacked structure of TiN/TaN/TiAlC/TiN/W or a stacked structure of TiN/TaN/TiN/TiAlC/TiN/W. In the drawings below, fins in the active region may not be illustrated for convenience of illustration, but it may be understood that embodiments of the inventive concepts are applicable to not only cells including planar transistors but also cells including fin field-effect transistors (FinFETs).

In some embodiments, the single height cells may be arranged to have mutually symmetrical structures in two adjacent rows. For example, as illustrated in FIG. 1, the first cell C11 and the second cell C12 may provide the same function as inverters including input pins A and output pins Y, but may have mutually symmetrical structures about a boundary between the first row R11 and the second row R12. Thus, an active region P12 for p-channel field effect transistor (PFET) and an active region N12 for n-channel field effect transistor (NFET) of the first cell C11 may be mutually symmetrical to an active region P13 for PFET and an active region N13 for NFET of the second cell C12, about the boundary between the first row R11 and the second row R12.

Power lines extending in the X-axis direction at the boundary between the first and second rows R11 and R12 may be arranged to supply power to the first through third cells C11 through C13. For example, as illustrated in FIG. 1, a first power line PL11 may extend in the X-axis direction at the boundary between the first row R11 and the second row R12, and the first cell C11 and the second cell C12 may share or comprise respective portions of the first power line PL11. Likewise, a third power line PL13 and a fourth power line PL14 may extend in the X-axis direction. Although a power line is illustrated and described herein as a pattern of an M1 layer, embodiments of the inventive concepts are not limited thereto, and in some embodiments, the power line may be formed as a pattern of a wiring layer above the M1 layer, for example, as a pattern of an M2 layer. In some embodiments, a first supply voltage may be applied to odd-numbered power lines and a second supply voltage may be applied to even-numbered power lines. For example, as illustrated in FIG. 1, a positive supply voltage VDD may be applied to the first power line PL11 while a negative supply voltage VSS is applied to the third power line PL13 adjacent to the first power line PL11 and the fourth power line PL14.

The third cell C13 may receive power from a fifth power line PL15 and a sixth power line PL16, which are electrically connected to the third power line PL13 supplying power to the first cell C11 and the fourth power line PL14 supplying power to the second cell C12, respectively. The fifth power line PL15 and the sixth power line PL16 may be individually arranged on a boundary of the third cell C13 and may extend in the X-axis direction. In the present specification, a power line arranged on the boundary of a multiple height cell, such as the fifth power line PL15 and the sixth power line PL16, may be referred to as an outbound power line. As illustrated in FIG. 1, when the third cell C13 is the double height cell, the fifth power line PL15 and the sixth power line PL16 may supply the same supply voltage, that is, the same negative supply voltage VSS.

The third cell C13 may include a second power line PL12, which is electrically connected to the first power line PL11 shared by the first cell C11 and the second cell C12, and extends in the X-axis direction in the first row R11. In other words, the second power line PL12 supplying the positive supply voltage VDD may be arranged in one direction from the center of the third cell C13, for example, at a position towards the fifth power line PL15 as illustrated in FIG. 1. Unlike as illustrated in FIG. 1, when the second power line PL12 is arranged at the same position as the first power line PL11, that is, at the center of the third cell C13, an area for routing of the M1 layer to which the second power line PL12 belongs may be divided into two in the third cell C13. However, since the second power line PL12 is arranged as illustrated in FIG. 1, a large area between the second power line PL12 and the sixth power line PL16 may be used for routing of input signals, output signals, and internal signals of the third cell C13. Accordingly, a structure of the multiple height cell such as the third cell C13 may be simplified, and the input pin of an increased size (for example, A in the third cell C13) and the output pin of an increased size (for example, Y in the third cell C13) may reduce routing congestion of the integrated circuit.

In some embodiments, a width D13 of the second power line PL12, that is, a length in the Y-axis direction, may be greater than a width of a pattern of the same layer as the second power line PL12. Widths of power lines (that is, lengths in the Y-axis direction), such as the first power line PL11, the third power line PL13, and the fourth power line PL14, supplying power to the first cell C11 and the second cell C12 as the single height cells may be greater than those of patterns of the same layer; the second power line PL12 included in the third cell C13 as the multiple height cell may also have the relatively large width D13; and in some embodiments, the width of the second power line PL12 may be identical to that (in other words, the length in the Y-axis direction) of the first power line PL11.

The third cell C13 may include active regions such as the active region P11 and the active region N11 which extend in the X-axis direction and are of different conductivity types. As illustrated in FIG. 1, the active region P11 for PFET or p-channel metal-oxide-semiconductor (PMOS) transistor may have a length in the Y-axis direction that is greater than a length of an active region P12 for PFET of the first cell C11, and may include at least a portion included in the first row R11. Similarly, the active region N11 for NFET or n-channel metal-oxide-semiconductor (NMOS) transistor may have a length in the Y-axis direction that is greater than a length of an active region N13 for NFET of the second cell C12, and may include at least a portion included in the second row R12. As such, the third cell C13 may have a structure that is at least partially independent of structures of the first cell C11 and the second cell C12, and thus may have a more efficient structure.

Figure 2:
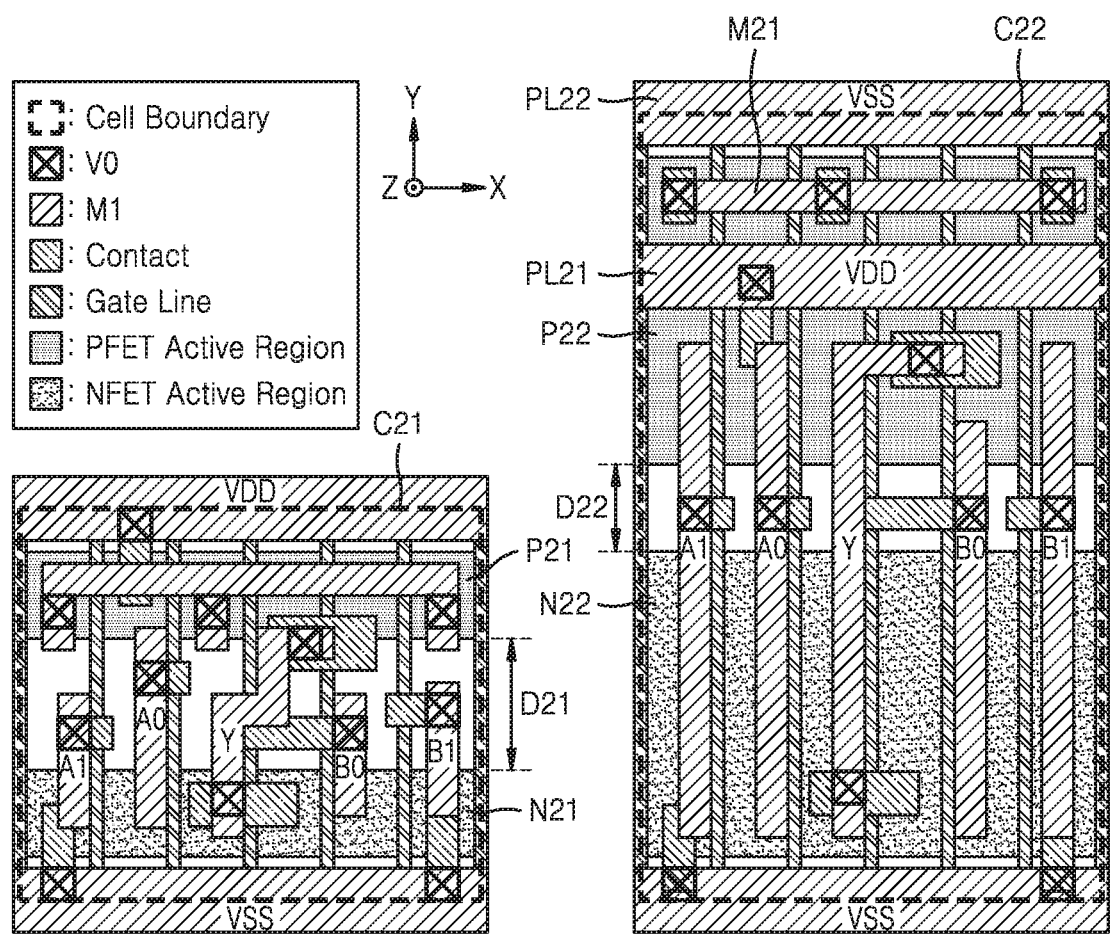
FIG. 2 illustrates plan views of cells according to some embodiments.

FIG. 2 illustrates plan views of a first cell C21 and a second cell C22 according to some embodiments. FIG. 2 illustrates the first cell C21 as a single height cell and the second cell C22 performing the same function as the first cell C21 as a multiple height cell.

Referring to FIG. 2, the first cell C21 may include an active region P21 for PFET and an active region N21 for NFET, which extend in the X-axis direction. The active region P21 and the active region N21 may be spaced apart or separated from each other by a first distance D21 in the Y-axis direction, and a fin extending in the X-axis direction in a region between the active region P21 and the active region N21 may be referred to as a dummy fin, which does not form or otherwise function as a transistor. In some embodiments, contacts, or gate contacts, that are connected to gates according to a design rule may be inhibited from being arranged in the active region, and accordingly, a distance between the active region P21 and the active region N21 (that is, the first distance D21) may increase for arrangement of the gate contacts for routing of multiple input pins A0, A1, B0, and B1, and the number of dummy fins may increase. In addition, areas of the active region P21 and the active region N21 may decrease due to a limited cell height and the increased first distance D21, and as a result, as a size of the transistor decreases, the performance (for example, an operating speed) of the first cell C21 may be limited. As such, in the first cell C21 having a limited height equal to a height of one row, a complicated configuration of the multiple input pins A0, A1, B0, and B1, the output pin Y, patterns for routing the internal signals (for example contacts), metal patterns, and vias may be accomplished according to the design rule.

The second cell C22 may provide the same function as the first cell C21 and may include an active region P22 for PFET and an active region N22 for NFET, which extend in the X-axis direction. The active region P22 and the active region N22 may be spaced apart or separated from each other by a second distance D22 in the Y-axis direction. A contact (that is, an active contact) and a metal pattern for routing a source and a drain of the transistor due to a relatively long length in the Y-axis direction of the active region P22 and the active region N22 may be mainly formed on the active region P22 and the active region N22, and accordingly, the gate contact for the multiple input pins A0, A1, B0, and B1 may be aligned in the X-axis direction. As a result, a distance between the active region P22 and the active region N22, that is, the second distance D22, may be less than the first distance D21, and thus, the number of dummy fins may decrease in the second cell C22. As such, compared with the first cell C21, a configuration of the multiple input pins A0, A1, B0, and B1, the output pin Y, patterns for routing the internal signals (for example contacts), metal patterns, and vias may be simply accomplished or otherwise routed with less complexity according to the design rule A first power line PL21 to which the positive supply voltage VDD is applied in the second cell C22 may extend in the X-axis direction at a position spaced apart or separated from the center or central region of the second cell C22 in the Y axis direction. In some embodiments, as illustrated in FIG. 2, the first power line PL21 may be arranged at a position spaced apart or separated from a second power line PL22 to which the negative supply voltage VSS is applied such that a conductive pattern M21 of the M1 layer for the internal signal is arranged between PL22 and PL21.

Figure 3:
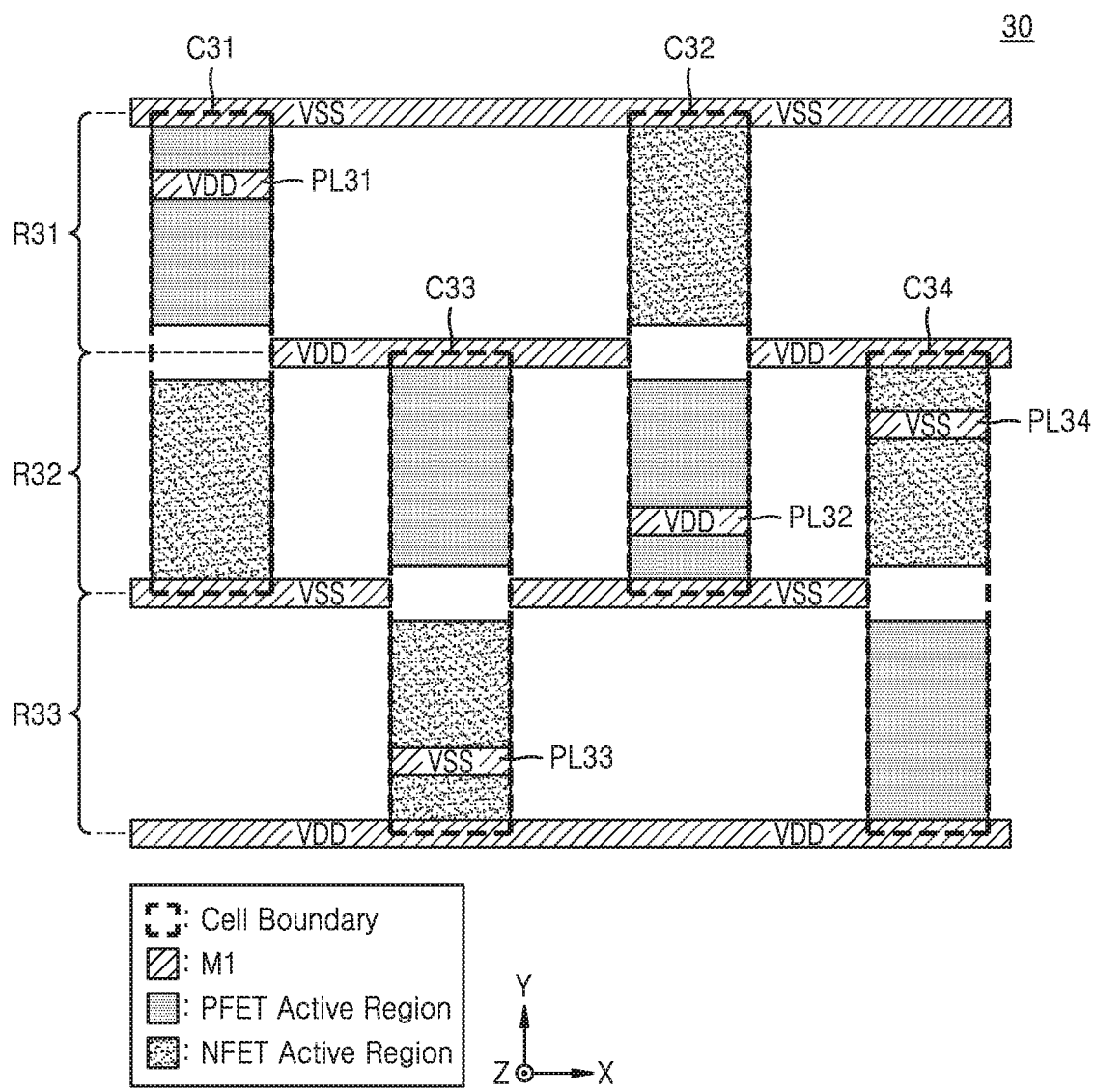
FIG. 3 is a plan view illustrating a layout of an integrated circuit according to some embodiments.

FIG. 3 is a plan view illustrating a layout of an integrated circuit 30 according to some embodiments. FIG. 3 illustrates the layout of the integrated circuit 30 including multiple height cells, which are a first cell C31, a second cell C32, a third cell C33, and a fourth cell C34, having different structures from each other while providing the same function and performance.

As described above with reference to FIG. 1, different supply voltages may be respectively applied to the odd-numbered power lines and the even-numbered power lines arranged at the boundaries of the rows and extending in the X-axis direction. Accordingly, a plurality of multiple height cells may be defined which have different structures while providing the same function and performance according to the supply voltages applied to the power lines, that is, the outbound power lines may be arranged at both boundaries of the multiple height cells. In addition, a plurality of multiple height cells may be defined which have different structures while providing the same function and performance depending on positions of the active regions included in the multiple height cells. For example, the first cell C31 and the second cell C32 may be continuously arranged on (e.g., may continuously extend into regions corresponding to) a first row R31 and a second row R32, but may respectively include active regions that are differently arranged. Due to the active regions being differently arranged, a first power line PL31, which is included in the first cell C31 and to which the positive supply voltage VDD is applied, may be arranged in the first row R31 in the active region for PFET, while a second power line PL32, which is included in the second cell C32 and to which the positive supply voltage VDD is applied, may be arranged in the second row R32 in the active region for PFET. For example, the third cell C33 and the fourth cell C34 may be continuously arranged in the second row R32 and a third row R33, but may respectively include active regions that are differently arranged. Due to the active regions being differently arranged, the third power line PL33, which is included in the third cell C33 and the negative supply voltage VSS is applied to, may be arranged in the third row R33 in the active region for NFET, while the fourth power line PL34, which is included in the fourth cell C34 and the negative supply voltage VSS is applied to, may be arranged in the second row R32 in the active region for NFET.

As described below with reference to FIG. 11, a cell library D112 that defines the layout of cells may define a plurality of layouts of multiple height cells which provide the same function and performance but have different structures, and one of the plurality of layouts may be selected and arranged in a process of generating layout data of the integrated circuit (for example, arrangement and routing operations). Hereinafter, embodiments of the inventive concepts will be mainly described with reference to multiple height cells such as the first cell C31 in FIG. 3 in which the negative supply voltage VSS is applied to the power lines extending in the X-axis direction at opposite boundaries in the Y-axis direction, and the active region for PFET is arranged in the (+) Y-axis direction and the active region for NFET is arranged in the (−) Y-axis direction, but embodiments are not limited thereto.

Figure 4A:
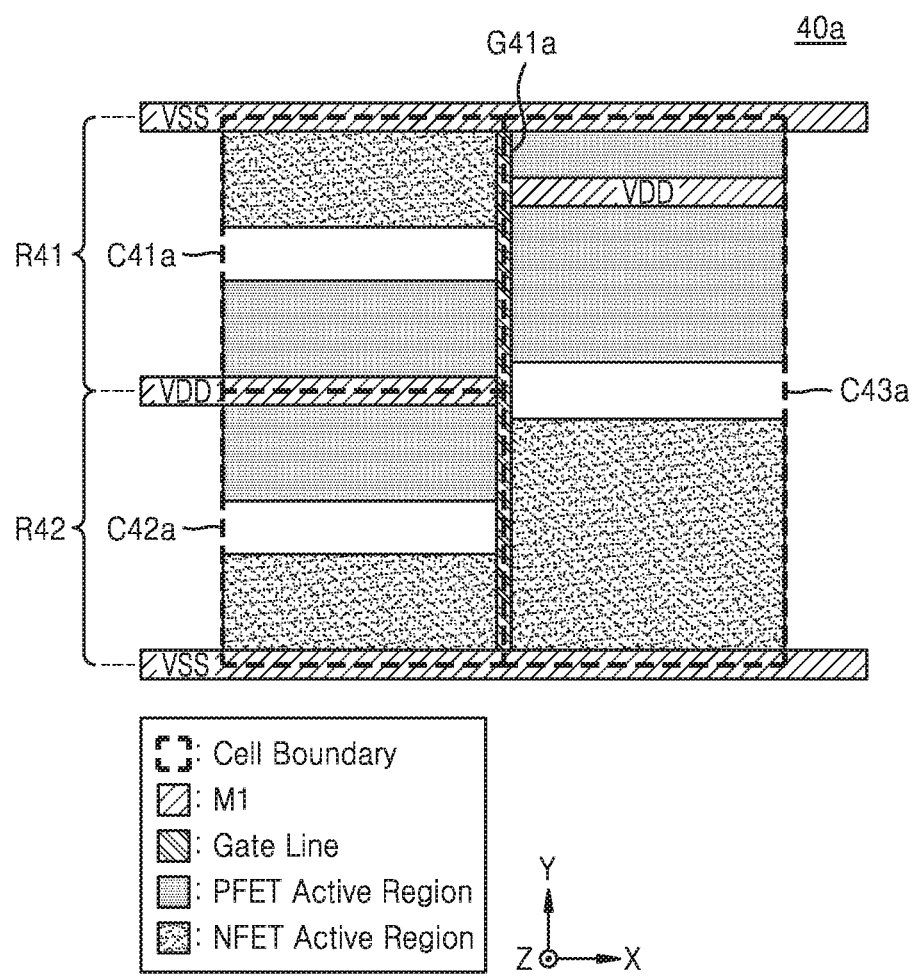
FIGS. 4A through 4C are plan views illustrating layouts of integrated circuits according to some embodiments.
Figure 4B:
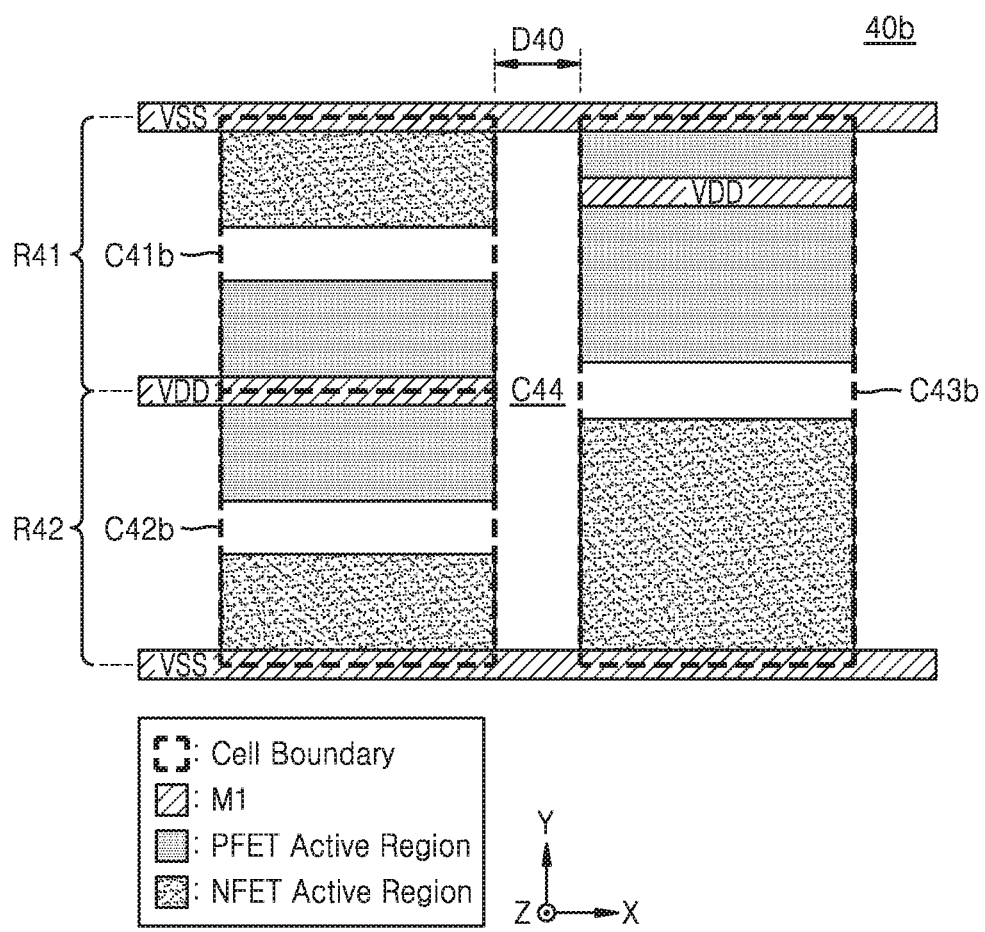
Figure 4C:
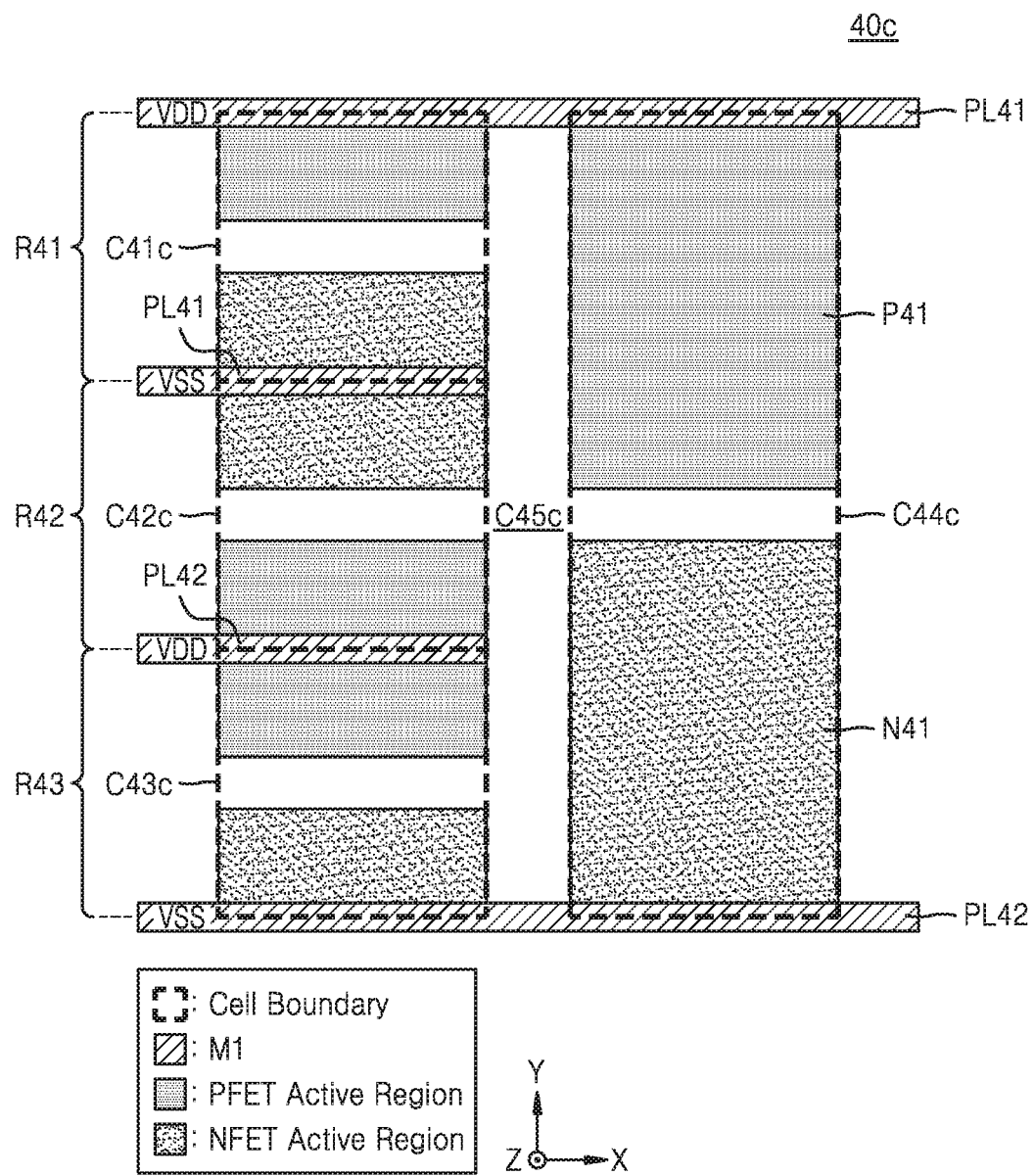

FIGS. 4A through 4C are plan views illustrating layouts of integrated circuits 40a, 40b, and 40c according to some embodiments. FIGS. 4A through 4C illustrate examples of interfaces between single height cells and a multiple height cell. For convenience of illustration, only some of the layers of the cells in FIGS. 4A through 4C are illustrated and repeated descriptions with reference to FIGS. 4A through 4C are omitted.

Referring to FIG. 4A, the integrated circuit 40a may include a first cell C41a arranged in a first row R41, a second cell C42a arranged in a second row R42, and a third cell C43a continuously arranged in the first row R41 and the second row R42. The first cell C41a and the third cell C43a may be mutually adjacent in the X-axis direction, and the second cell C42a and the third cell C43a may also be mutually adjacent in the X-axis direction. The first cell C41a, the second cell C42a, and the third cell C43a may share a gate line G41a extending in the Y-axis direction along a boundary between the single height cells C41a, C42a and the multiple height cell C43a. In some embodiments, the gate line G41a may not define or form a transistor and, in other words, may be a dummy gate line. In some embodiments, a single diffusion break (SDB) extending in the Y-axis direction at the boundary between the first cell C41a and the third cell C43a may be formed, and may be formed under the gate line G41a or in a region where the gate line G41a is removed.

Referring to FIG. 4B, the integrated circuit 40b may include a first cell C41b arranged in a first row R41, a second cell C42b arranged in a second row R42, and a third cell C43b continuously arranged in the first row R41 and the second row R42, and may further include a fourth cell C44 continuously arranged in the first row R41 and the second row R42 between the first cell C41b and the third cell C43b, and between the second cell C42 and the third cell C43b. A cell such as the fourth cell C44 in the present specification, which is arranged between the single height cells and the multiple height cell and performs a function of connecting (or is otherwise configured to connect) the multiple height cell having a structure independent of the single height cell to the single height cells, may be referred to as an interface cell. Examples of the interface cell are described below with reference to FIGS. 5A through 6D and the like.

Figure 5A:
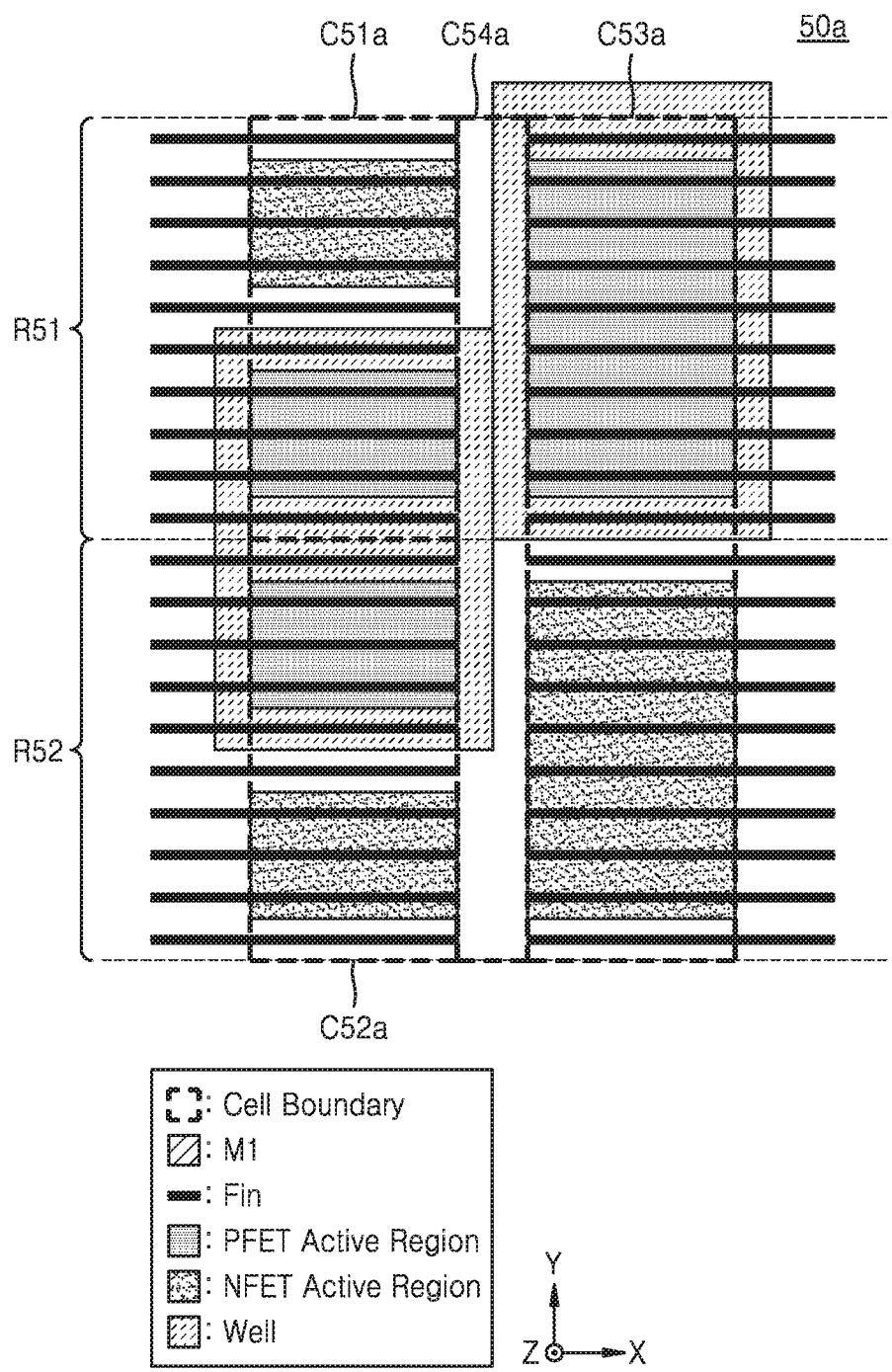
FIGS. 5A and 5B are plan views illustrating layouts of integrated circuits according to some embodiments.
Figure 5B:
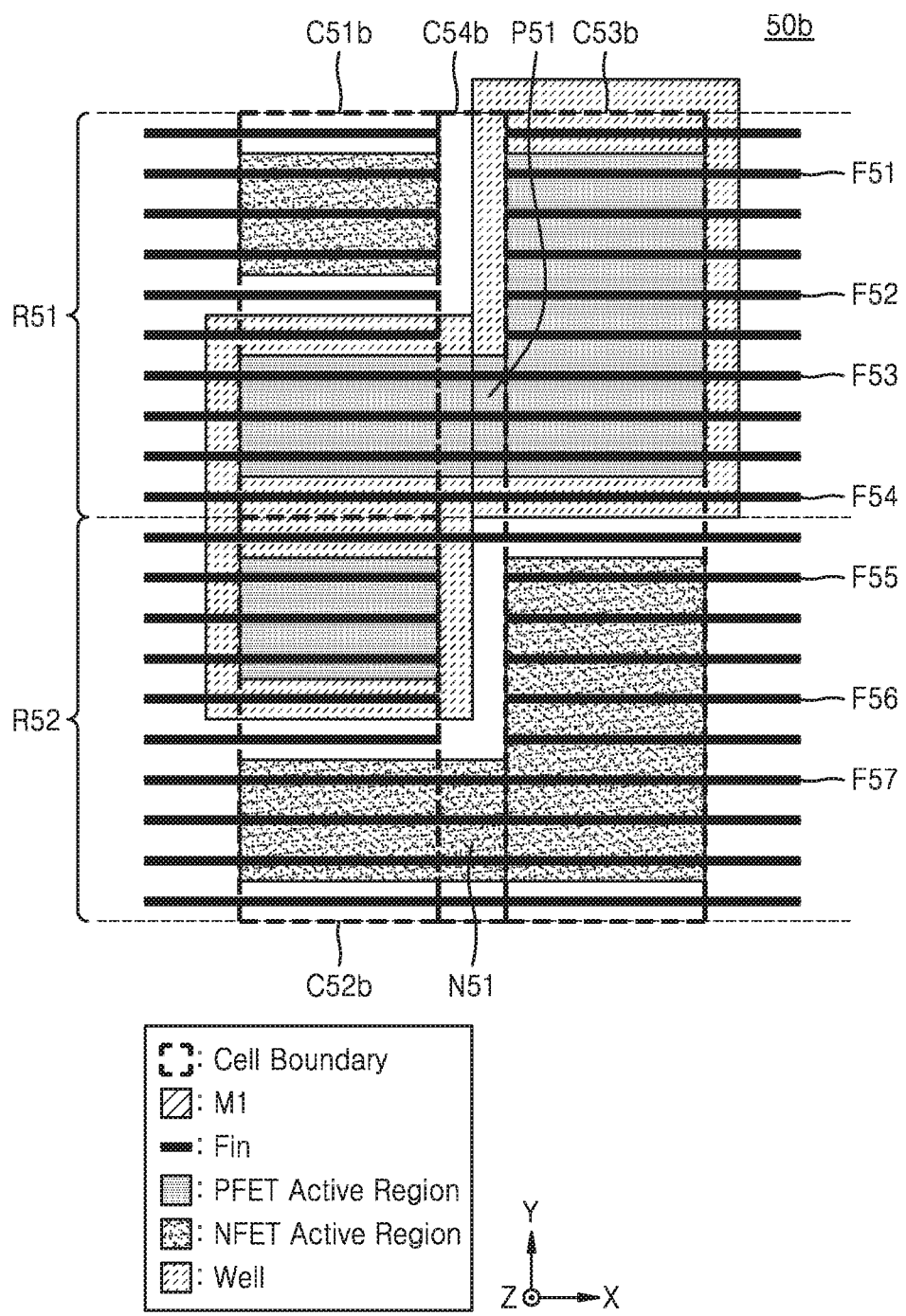

A length in the X-axis direction of the fourth cell C44, that is, a width D40, may be determined by a semiconductor process of manufacturing the integrated circuit 40b. For example, as illustrated in FIG. 4B, the active region for PFET of the third cell C43b may include a portion overlapping the active region for NFET of the first cell C41b in the X-axis direction. Thus, the fourth cell C44 as the interface cell may have a structure in which the active region for PFET of the third cell C43b and the active region for NFET of the first cell C41b are separated. The design rule for the semiconductor process may define a minimum separation distance (or a minimum space) between active regions of different conductivity types, a minimum separation distance between the gate line and the active region, and the like. In addition, in some embodiments, as illustrated in FIGS. 5A and 5B, when the active region for PFET is formed in a well, the design rule may define a minimum separation distance from the well to the active region for NFET. As such, the width D40 of the fourth cell C44 may be determined based on the minimum separation distances between the active regions of different conductivity types defined by the design rule. In some embodiments, the cells included in the integrated circuit 40b may share the gate lines extending in the Y-axis direction at the boundary with adjacent cells and may have widths corresponding to a multiple of a pitch of the gate lines, that is, a multiple of one contacted poly pitch (CPP), and the width D40 of the fourth cell C44 may also have a width corresponding to a multiple of the CPPs.

Referring to FIG. 4C, the integrated circuit 40c may include a first cell C41c arranged in a first row R41, a second cell C42c arranged in the second row R42, a third cell C43c arranged in a third row R43, which are the single height cells, and may include a fourth cell C44c and a fifth cell C45c, which are the multiple height cells and arranged in three continuous rows (e.g., may continuously extend into regions corresponding to rows R41, R42, and R43), where the fifth cell C45c may function as the interface cell.

As illustrated in FIG. 4C, the fourth cell C44c continuously arranged in three rows may receive power from respective outbound power lines, to which different supply voltages are applied. For example, as illustrated in FIG. 4C, a first power line PL41 to which the positive supply voltage VDD is applied may be arranged at one side boundary, and a second power line PL42 to which the negative supply voltage VSS is applied may be arranged at the other side boundary. As illustrated in FIG. 4C, in the case where an active region P41 for PFET of the fourth cell C44c may be arranged adjacent to a first power line PL41 and an active region N41 for NFET of the fourth cell C44c may be arranged adjacent to a second power line PL42, a power line included in the fourth cell C44c for providing a supply voltage (like the first power line PL11 in FIG. 1) may be omitted. As described above with reference to FIG. 4B, the fifth cell C45c as the interface cell may include a portion separating the active regions for NFET of the first cell C41c and the second cell C42c from the active region for PFET of the fourth cell C44c, and may include a portion separating active regions for PFET of the third cell C43c and the second cell C42c from the active region N41 for NFET of the fourth cell C44c.

Although the interface cells, for example, the fourth and fifth cells C44 and C45c, arranged on left sides (that is, the (−) X-axis direction) of or relative to the multiple height cells are illustrated in FIGS. 4B and 4C, respectively, the interface cells, for example, the fourth and fifth cells C44 and C45c, may be arranged on opposite sides of or relative to the multiple height cells (that is the (+) X-axis direction). Hereinafter, it will be appreciated that although examples of the interface cells arranged on the left sides of or relative to the multiple height cells are mainly described, embodiments are not limited thereto.

FIGS. 5A and 5B are plan views illustrating layouts of integrated circuits 50a and 50b according to some embodiments. FIGS. 5A and 5B illustrate examples of interface cells which differently handle a plurality of fins extending in the X-axis direction and being parallel to each other. Overlapping contents in descriptions to be given with reference to FIGS. 5A and 5B will be omitted.

Referring to FIG. 5A, the integrated circuit 50a may include a first cell C51a arranged in a first row R51, a second cell C52a arranged in a second row R52, and a third cell C53a and a fourth cell C54a continuously arranged in the first row R51 and the second row R52. The fourth cell C54a as the interface cell may cut off a plurality of fins extending in the X-axis direction and being parallel to each other. That is, the fourth cell C54a may be free of the fins extending in the X-axis direction. In some embodiments, wells of the first cell C51a and the second cell C52a, and a well of the third cell C53a may extend in the X-axis direction into the fourth cell C54a, and terminate in the fourth cell C54a. In some embodiments, as illustrated in FIG. 5A, the fourth cell C54a may interconnect the wells of the first cell C51a and the second cell C53a.

Referring to FIG. 5B, the integrated circuit 50b may include a first cell C51b arranged in the first row R51, a second cell C52b arranged in the second row R52, and a third cell C53b and a fourth cell C54b continuously arranged in the first row R51 and the second row R52. The fourth cell C54b as the interface cell may not cut off at least a portion of a plurality of fins extending in the X-axis direction and being parallel to each other. For example, as illustrated in FIG. 5B, a first fin F51 and a fifth fin F55 extending over the active region for NFET and the active region for PFET may be cut off in the fourth cell C54b, and a second fin F52 and a sixth fin F56 including portions extending over between the active regions may be cut off in the fourth cell C54b. On the other hand, a third fin F53 and a seventh fin F57 extending over the active regions of the same conductivity type may not be cut off in the fourth cell C54b, and a fourth fin F54 (that is, the dummy fin) may not also be cut off in the fourth cell C54b. That is, the fins F53, F54, and F57 may continuously extend across the boundary between the single height cells C51b, C52b and the multiple height cells C53b, C54b.

In some embodiments, an interface cell may include an active region that connects two active regions of a single height cell and multiple height cell in the X-axis direction, which have the same conductivity type. For example, as illustrated in FIG. 5B, the fourth cell C54b may include an active region P51 for PFET that overlaps the active region for PFET of the first cell C51b and the active region for PFET of the third cell C53b in the X-axis direction. In addition, the fourth cell C54b may include an active region N51 for NFET that overlaps the active region for NFET of the second cell C52b and the active region for NFET of the third cell C53b in the X-axis direction.

Figure 6A:
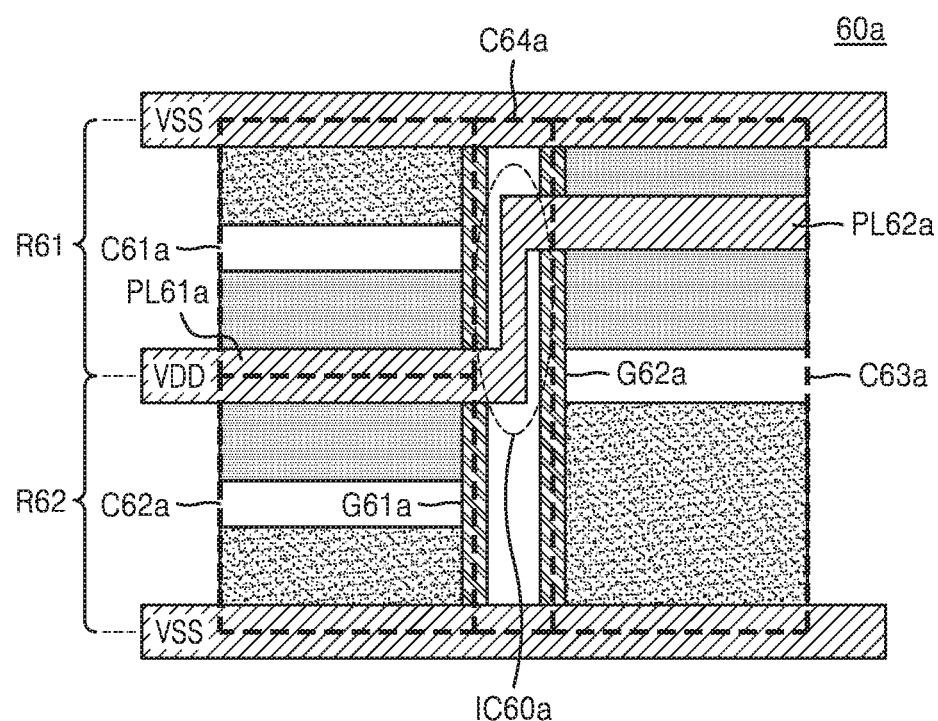
FIGS. 6A through 6D are plan views illustrating layouts of integrated circuits according to some embodiments.
Figure 6B:
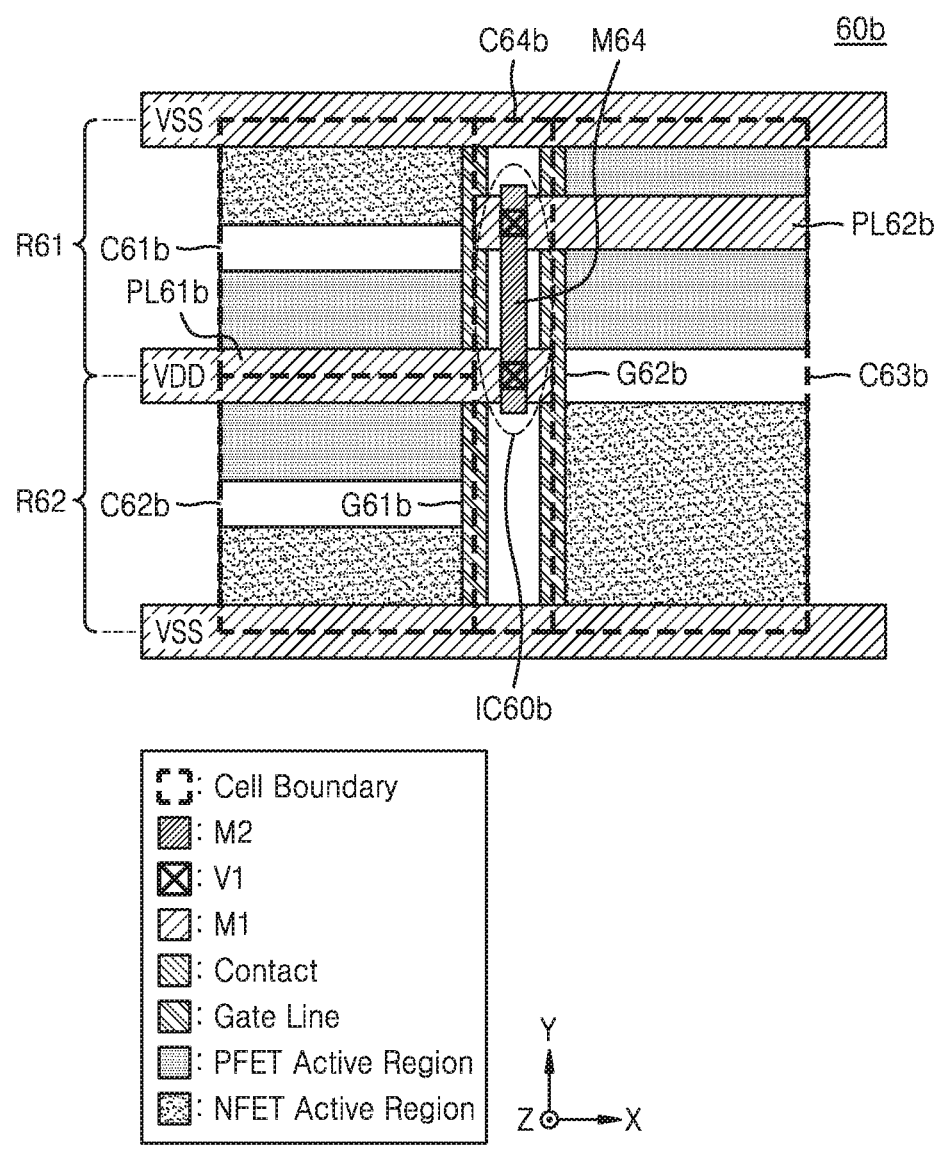
Figure 6C:
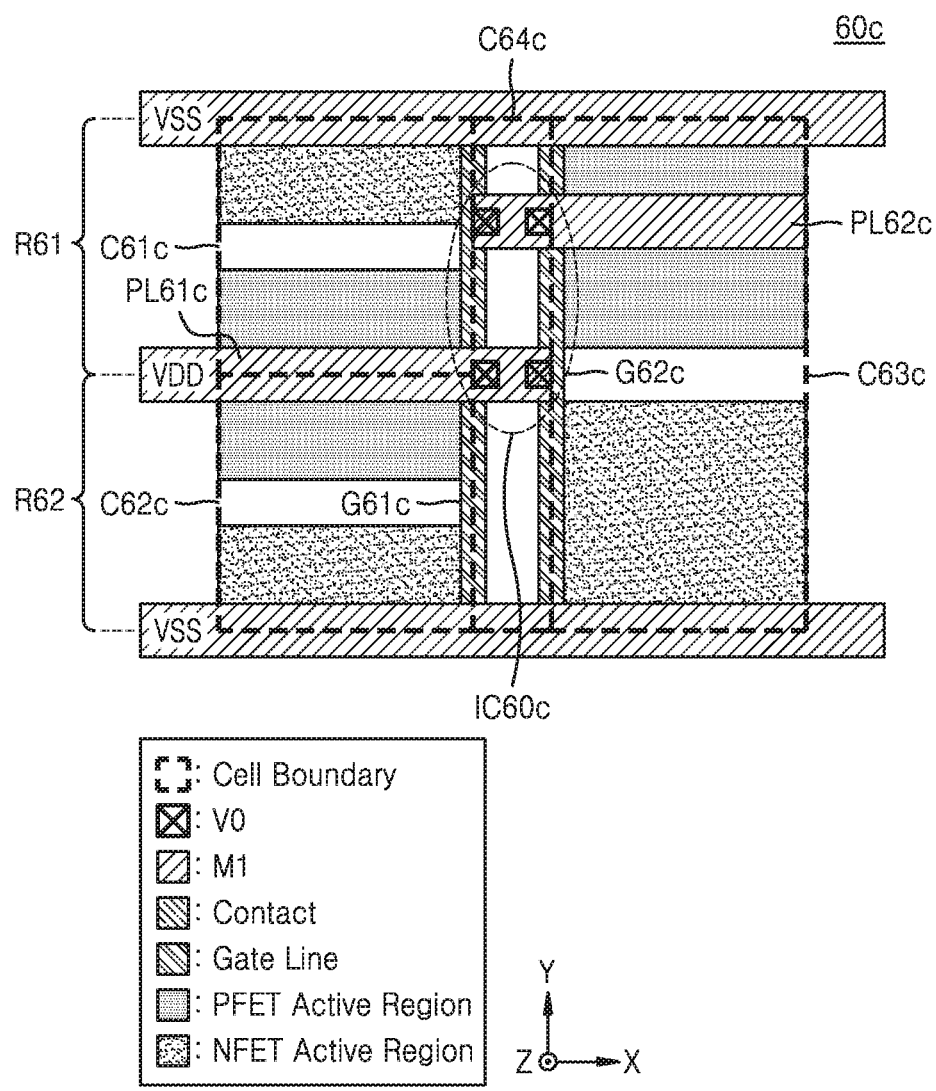

FIGS. 6A through 6C are plan views illustrating layouts of integrated circuits 60a, 60b, 60c, and 60d according to some embodiments. FIGS. 6A through 6D illustrate examples of interface cells variously connecting the power lines of single height cells to the power lines included in multiple height cells. Hereinafter, similar or overlapping content in descriptions with reference to FIGS. 6A through 6B will be omitted.

An interface cell (for example, C64a in FIG. 6A) arranged between single height cells (for example, C61a and C62a in FIG. 6A) and a multiple height cell (for example, C63a in FIG. 6A) may include an interconnection (for example, IC60a in FIG. 6A) for electrically connecting power lines of the single height cells to power lines of the multiple height cell (for example, PL61a and PL62a in FIG. 6A). The interconnection included in the interface cell may include at least one conductive pattern extending in the Y-axis direction to electrically connect the power lines arranged at different locations in the Y-axis direction. As described with reference to FIGS. 6A through 6D, the interconnections included in the interface cells C64a may include various types of conductive patterns, and in some embodiments, two or more conductive patterns among the conductive patterns illustrated in FIGS. 6A through 6D may be arranged parallel to each other and combined together. In the examples in FIGS. 6A through 6D, the interface cell (for example, C64a in FIG. 6A) may be illustrated as having a pitch, that is, a width of one CPP between a pair of gate lines (for example, C61a and C62a in FIG. 6A), but it will be appreciated that embodiments of the inventive concepts are applicable to an interface cell having a width of two CPPs or more.

Referring to FIG. 6A, the integrated circuit 60a may include a first cell C61a arranged in a first row R61, a second cell C62a arranged in a second row R62, and a third cell C63a and a fourth cell C64a continuously arranged in the first row R61 and the second row R62. The third cell C63a, as the multiple height cell, may include a second power line PL62a extending in the X-axis direction in the active region for PFET and offset from a first power line PL61a, and a source of a transistor formed on the active region for PFET of the third cell C63a may be supplied with the positive supply voltage VDD from the second power line PL62a.

The fourth cell C64a, as the interface cell, may include the interconnection IC60a which electrically connects a first power line PL61a shared by the first cell C61a and the second cell C62a to the second power line PL62a of the third cell C63a. As illustrated in FIG. 6A, the interconnection IC60a may include a portion that is a pattern of the same M1 layer as the first power line PL61a and the second power line PL62a, and extends in the Y-axis direction. Accordingly, the first power line PL61a may be electrically connected to the second power line PL62a, and the positive supply voltage VDD may be applied to the second power line PL62a. A first gate line G61a and a second gate line G62a may extend in the Y-axis direction parallel to each other at a boundary of the fourth cell C64a, and may be dummy gate lines.

Referring to FIG. 6B, the integrated circuit 60b may include a first cell C61b arranged in the first row R61, a second cell C62b arranged in the second row R62, and a third cell C63b and a fourth cell C64b continuously arranged in the first row R61 and the second row R62. The third cell C63b, as the multiple height cell, may include a second power line PL62b extending in the X-axis direction in the active region for PFET and offset from a first power line PL61b, and a source of a transistor formed in the active region for PFET of the third cell C63b may be supplied with the positive supply voltage VDD from the second power line PL62b.

The fourth cell C64b, as the interface cell, may include an interconnection IC60b, and the interconnection IC60b may include a pattern M64 that is a pattern of an M2 layer (or other layer higher than that of the first power line PL61b and the second power line PL62b), and extends in the Y-axis direction. As illustrated in FIG. 6B, the interconnection IC60b may include a pattern of the M1 layer extending the first power line PL61b in the X-axis direction and a pattern of the M1 layer extending the second power line PL62b in the X-axis direction, and may include the pattern M64 of the M2 layer connected to the patterns of the M1 layer by conductive vias. Accordingly, the first power line PL61b may be electrically connected to the second power line PL62b, and the positive supply voltage VDD may be applied to the second power line PL62b. A first gate line G61b and a second gate line G62b may extend in the Y-axis direction parallel to each other at a boundary of the fourth cell C64b, and may be the dummy gate lines.

Referring to FIG. 6C, the integrated circuit 60c may include a first cell C61c arranged in the first row R61, a second cell C62c arranged in the second row R62, and a third cell C63c and a fourth cell C64c continuously arranged in the first row R61 and the second row R62. The third cell C63c, as the multiple height cell, may include a second power line PL62c extending in the X-axis direction in the active region for PFET and offset from a first power line PL61c, and a source of a transistor formed on the active region for PFET of the third cell C63c may be supplied with the positive supply voltage VDD from the second power line PL62c.

The fourth cell C64c, as the interface cell, may include an interconnection IC60c, and the interconnection IC60c may include portions of a first gate line G61c and a second gate line G62c, which extend in parallel in the Y-axis direction at a boundary of the fourth cell C64c. As illustrated in FIG. 6C, the interconnection IC60c may include a pattern of the M1 layer extending a first power line PL61c in the X-axis direction and a pattern of the M1 layer extending the second power line PL62c in the X-axis direction, and may include contacts and conductive vias connecting the patterns of the M1 layer to the first gate line G61c and the second gate line G62c. Accordingly, the first power line PL61c may be electrically connected to the second power line PL62c, and the positive supply voltage VDD may be applied to the second power line PL62c.

Figure 6D:
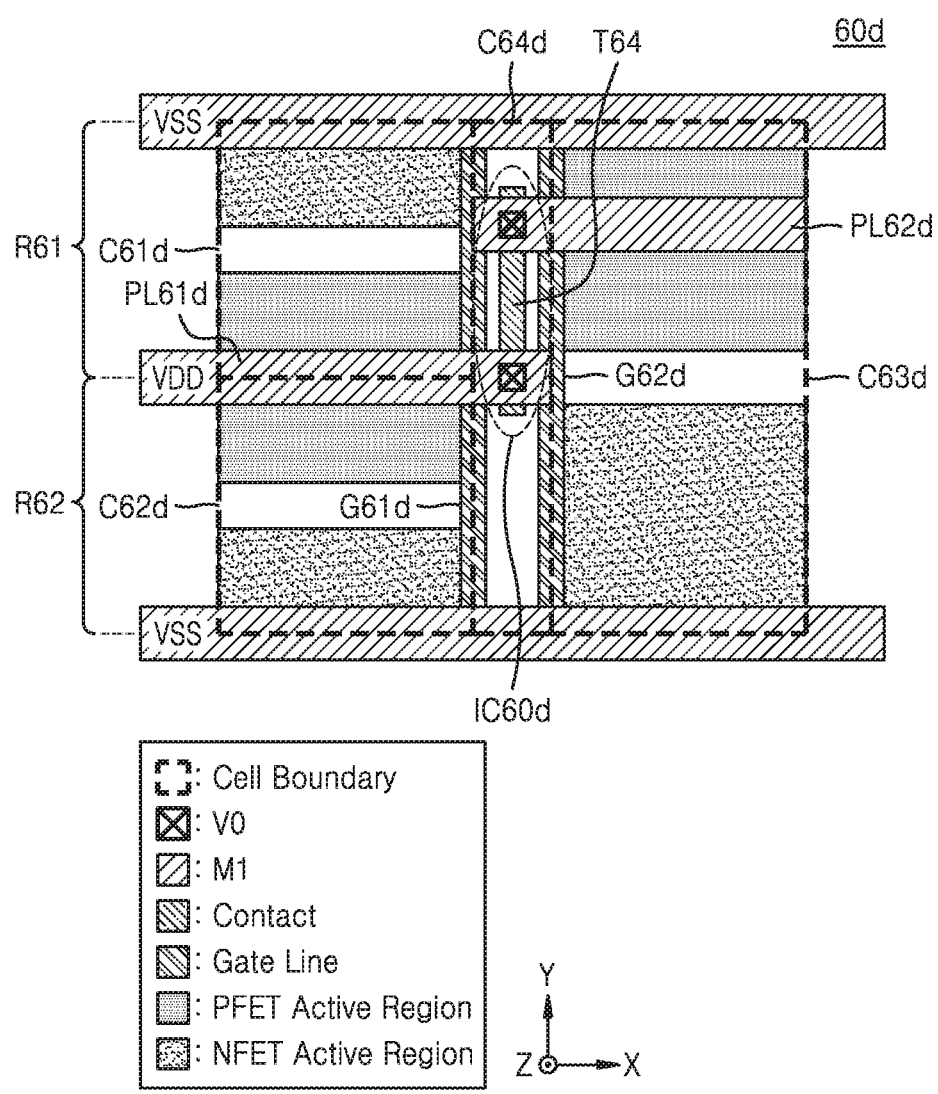

Referring to FIG. 6D, the integrated circuit 60d may include a first cell C61d arranged in the first row R61, a second cell C62d arranged in the second row R62, and a third cell C63d and a fourth cell C64d continuously arranged in the first row R61 and the second row R62. The third cell C63d, as the multiple height cell, may include a second power line PL62d extending in the X-axis direction in the active region for PFET and offset from a first power line PL61d, and a transistor formed on the active region for PFET of the third cell C63d may be supplied with the positive supply voltage VDD from the second power line PL62d.

In some embodiments, uni-directional patterns may be mainly formed in the M1 and M2 layers. Accordingly, it may not be easy to form a pattern of the M1 layer extending in the Y-axis direction in which the power lines extending in the X-axis direction are formed as illustrated in FIG. 6A, and thus, structures illustrated in FIGS. 6B through 6D may be employed.

The fourth cell C64d, as the interface cell, may include an interconnection IC60d, and the interconnection IC60d may include a contact T64 that is a pattern of a layer lower than the M1 layer of the first power line PL61d and the second power line PL62d, and extends in the Y-axis direction. As illustrated in FIG. 6D, the interconnection IC60d may include a pattern of the M1 layer extending the first power line PL61d in the X-axis direction and a pattern of the M1 layer extending the second power line PL62d in the X-axis direction, and may include the contact T64 connected to the patterns of the M1 layer by conductive vias. Accordingly, the first power line PL61d may be electrically connected to the second power line PL62d, and the positive supply voltage VDD may be applied to the second power line PL62d. A first gate line G61d and a second gate line G62d may extend parallel to each other in the Y-axis direction at a boundary of the fourth cell C64d, and may be the dummy gate lines.

Figure 7A:
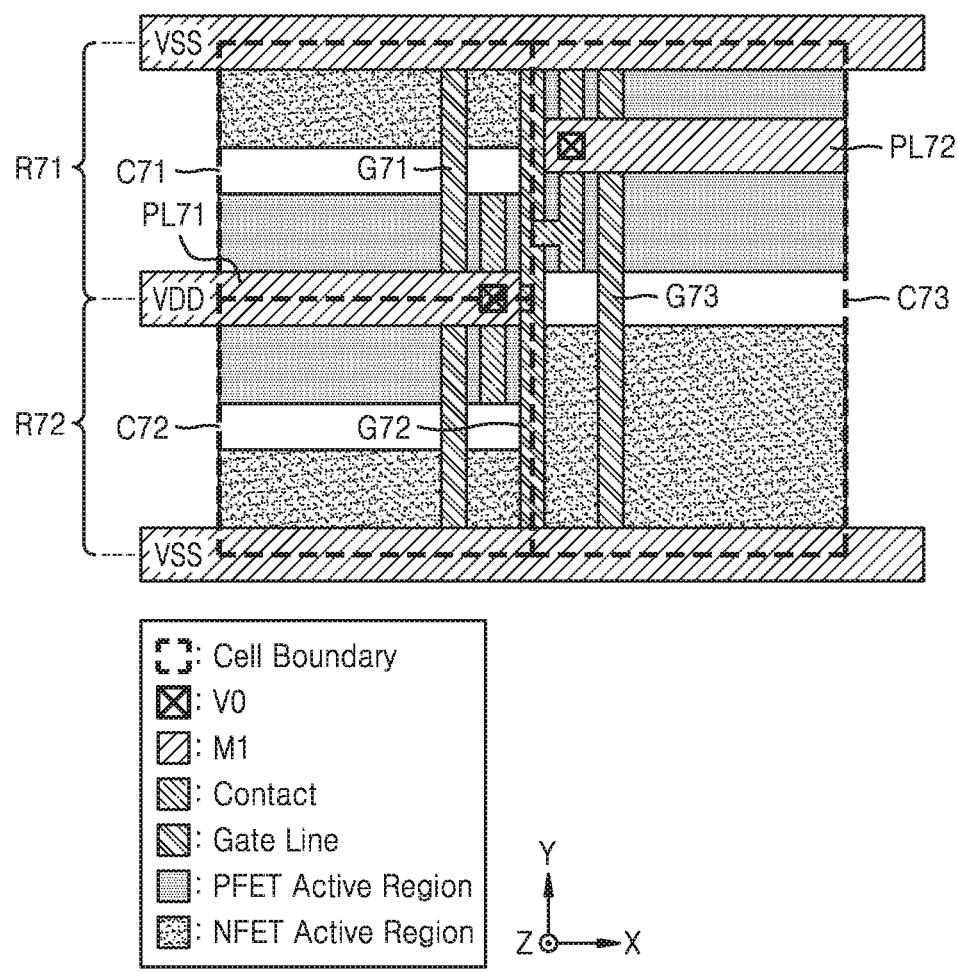
FIGS. 7A and 7B are respectively a plan view and a perspective view illustrating layouts of an integrated circuit according to some embodiments.
Figure 7B:
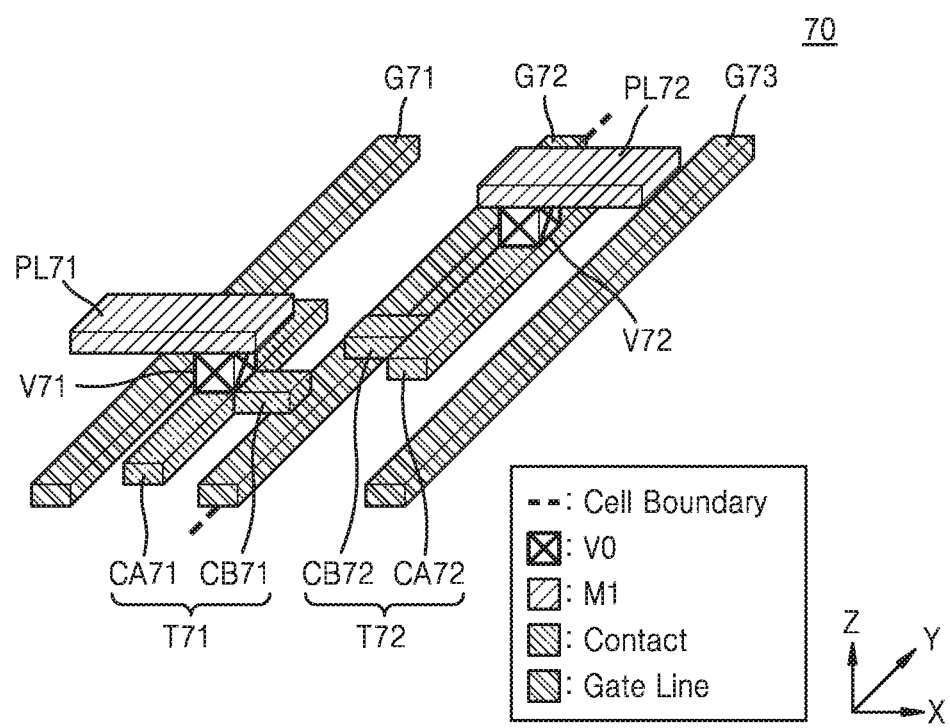

FIGS. 7A and 7B are a plan view and a perspective view, respectively, illustrating layouts of an integrated circuit 70 according to some embodiments. FIGS. 7A and 7B illustrate an example of a structure connecting power lines of single height cells and a multiple height cell which are arranged adjacent to each other.

Referring to FIG. 7A, the integrated circuit 70 may include a first cell C71 arranged in a first row R71, a second cell C72 arranged in a second row R72, and a third cell C73 continuously arranged in the first row R71 and the second row R72. The first cell C71 and the second cell C72 may share or comprise respective portions of a first power line PL71. The third cell C73, as the multiple height cell, may include a second power line PL72 extending in the X-axis direction in the active region for PFET and offset from a first power line PL71, and a transistor formed in the active region for PFET of the third cell C73 may be supplied with the positive supply voltage VDD from the second power line PL72.

A first gate line G71 may extend in the Y-axis direction across the first cell C71 and the second cell C72, and the third gate line G73 may extend in the Y-axis direction in the third cell C73. A second gate line G72 may extend in the Y-axis direction along a boundary of the third cell C73 between the first gate line G71 and the third gate line G73, and may connect the first power line PL71 to the second power line PL72.

Referring to FIG. 7B, the first power line PL71 may be connected to the second gate line G72 by a first via V71 and a first contact T71. In addition, the second power line PL72 may be connected to the second gate line G72 by a second via V72 and a second contact T72. In some embodiments, contacts may be divided into active contacts connected to active regions and gate contacts connected to gate lines. For example, the first contact T71 may include an active contact CA71 which extends in the Y-axis direction and is connected to the active region between the first gate line G71 and the second gate line G72, and a gate contact CB71 which extends in the X-axis direction and is connected to the second gate line G72. Similarly, the second contact T72 may include an active contact CA72 which extends in the Y-axis direction and is connected to the active region between the second gate line G72 and the third gate line G73, and a gate contact CB72 which extends in the X-axis direction and is connected to the second gate line G72.

Figure 8A:
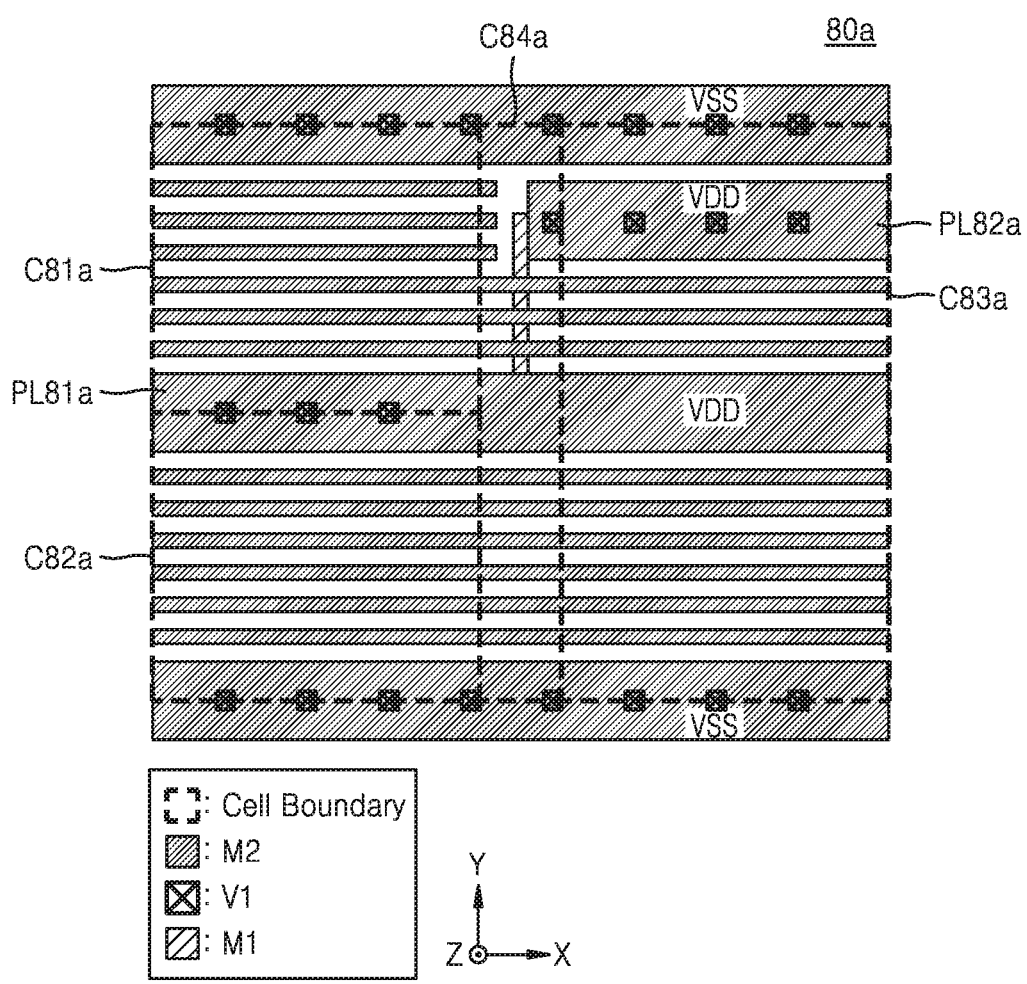
FIGS. 8A and 8B are plan views illustrating layouts of integrated circuits according to some embodiments.
Figure 8B:
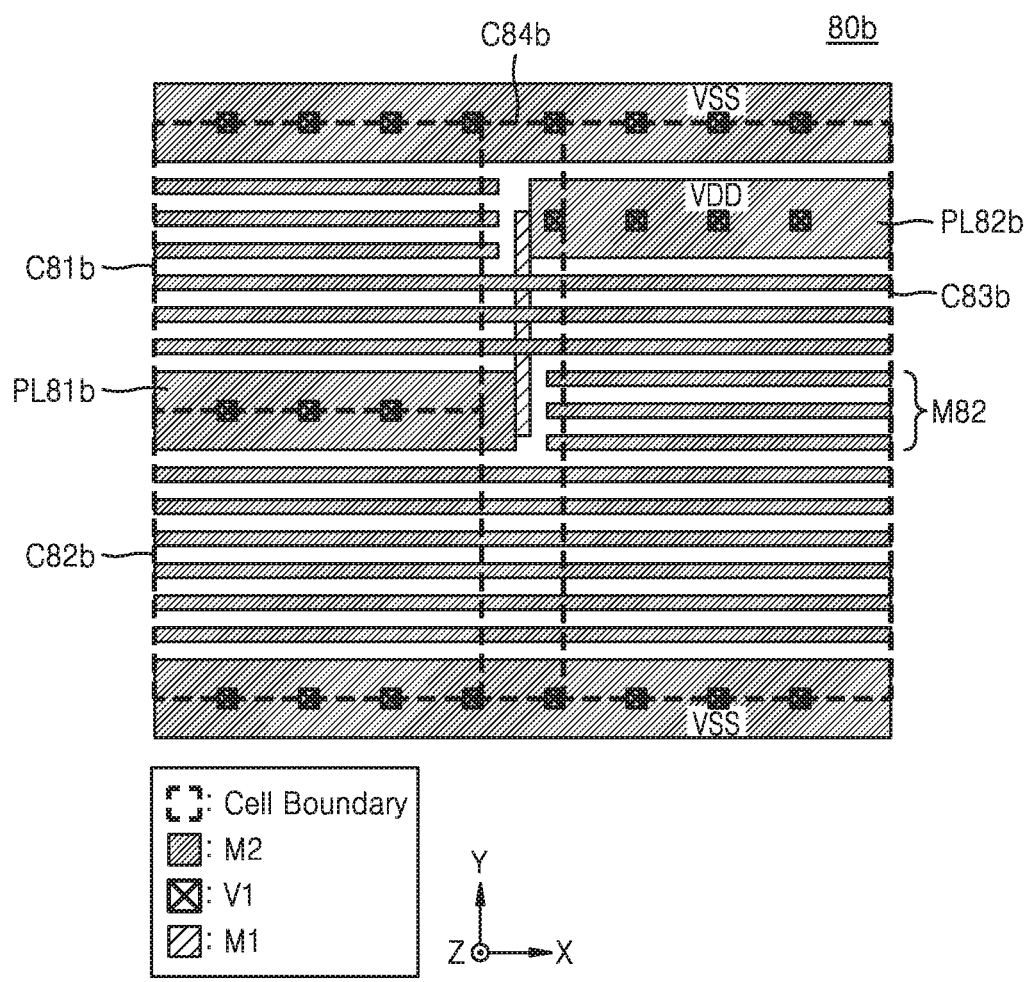

FIGS. 8A and 8B are plan views illustrating layouts of integrated circuits 80a and 80b according to some embodiments. FIGS. 8A and 8B illustrate examples of patterns of the M2 layer as an upper wiring layer on single height cells and multiple height cells. Overlapping contents in descriptions to be given with reference to FIGS. 8A and 8B will be omitted.

Referring to FIG. 8A, the integrated circuit 80a may include a first cell C81a and a second cell C82a as the single height cells and may include a third cell C83a and a fourth cell C84a as the multiple height cells. As illustrated in FIG. 8A, the M2 layer may include patterns extending in the X-axis direction for routing signals. In addition, the M2 layer, above power lines of the M1 layer, may include power lines which are connected to the power lines of the M1 layer by conductive vias and extend in the X-axis direction, and the power lines of the M2 layer may be referred to as upper power lines. For example, a first power line PL81a of the M2 layer may extend in the X-axis direction at a boundary between the first cell C81a and the second cell C82a, and a second power line PL82a of the M2 layer may extend in the X-axis direction in the third cell C83a.

In some embodiments, a power line of the M2 layer shared by the single height cells may extend across the multiple height cell. For example, as illustrated in FIG. 8A, the first power line PL81a of the M2 layer extending in the X-axis direction at a boundary between the first cell C81a and the second cell C82a may extend in the X-axis direction across the fourth cell C84a, which is the interface cell, and the third cell C83. As illustrated in FIG. 8A, in a portion where the first power line PL81a overlaps the third cell C83a in the Z-axis direction, the third cell C83a may not need the power line of the M1 layer applying the positive supply voltage VDD, and thus, the vias may not be formed.

Referring to FIG. 8B, the integrated circuit 80b may include a first cell C81b and a second cell C82b as the single height cells and may include a third cell C83b and a fourth cell C84b as the multiple height cells. In some embodiments, a power line of the M2 layer shared by the single height cells may be cut off in the multiple height cell, and patterns for routing signals may be formed in a region in which the power line of the M2 layer is cut off. For example, as illustrated in FIG. 8B, a first power line PL81b in the integrated circuit 80b of FIG. 8B may have an end in an interface cell C84b, and a region corresponding to the first power line PL81b in the third cell C83c may include patterns M82 for routing the signals. Thus, while transferability of the positive supply voltage VDD in the integrated circuit 80a of FIG. 8A is enhanced, an improved routing flexibility of signals in the integrated circuit 80b of FIG. 8B may be provided.

Figure 9:
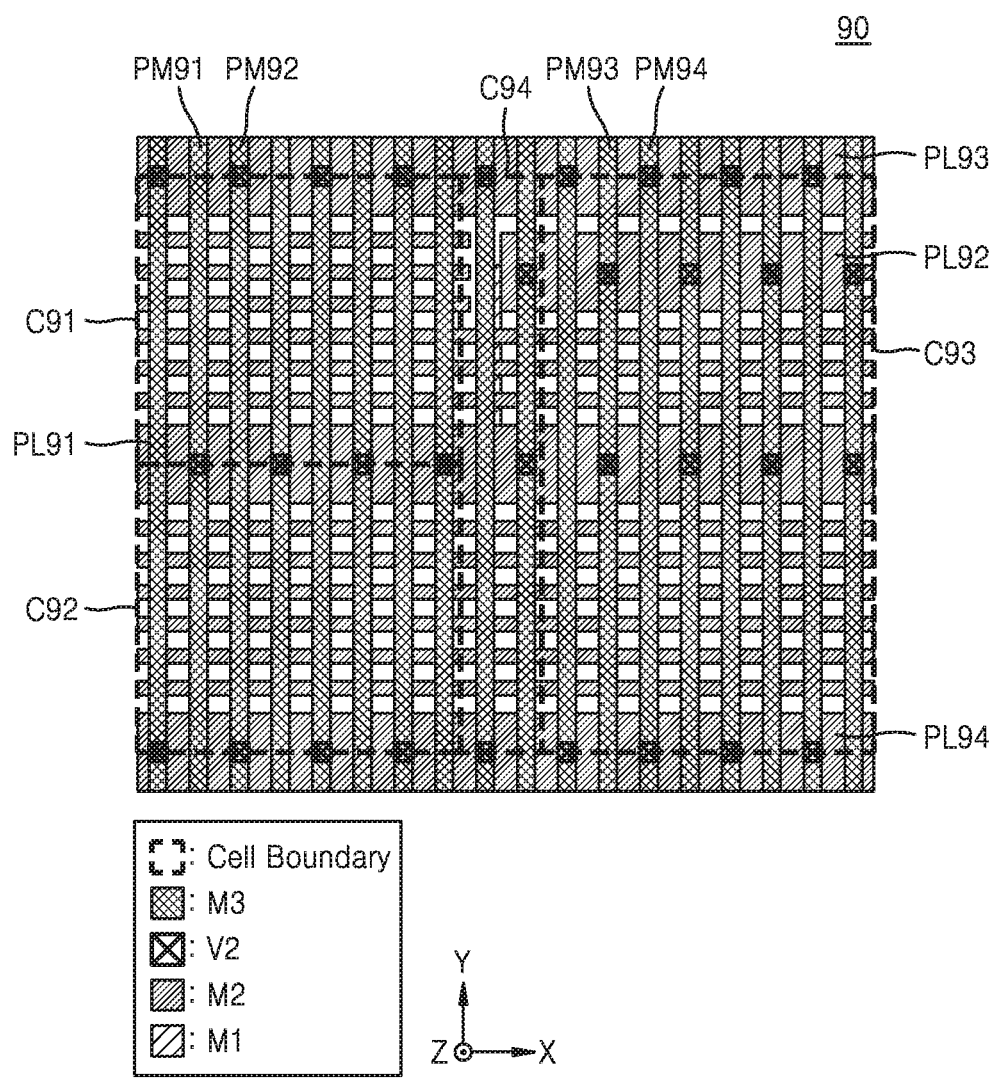
FIG. 9 is a plan view illustrating a layout of an integrated circuit according to some embodiments.

FIG. 9 is a plan view illustrating a layout of an integrated circuit 90 according to some embodiments. FIG. 9 illustrates an example of patterns that form a power mesh in single height cells and a multi-height cell. In FIG. 9, the power mesh is illustrated to include patterns of an M3 layer, but in some embodiments, the power mesh may include patterns of a wiring layer higher than the M3 layer.

The integrated circuit 90 may include a first cell C91 and a second cell C92 as single height cells and may include a third cell C93 and a fourth cell C94 as multiple height cells. As illustrated above with reference to FIGS. 8A and 8B, a first power line PL91 of the M2 layer may extend in the X-axis direction, and a second power line PL92 electrically connected to the first power line PL91 may also extend in the X-axis direction. In addition, as illustrated in FIG. 9, the third power line PL93 and the fourth power line PL94 may extend in the X-axis direction.

Patterns (for example, first through fourth power mesh lines PM91 through PM94) extending in the Y-axis direction for routing supply voltages on an M3 layer may be formed, and the patterns of the M3 layer may form a power mesh. The power mesh may refer to patterns that are regularly arranged (e.g., at periodic intervals or spacings) to supply power cells included in the integrated circuit 90, and the patterns included in the power mesh may be referred to as power mesh lines. The power mesh lines may be connected to the power lines of the M2 layer by conductive vias V2.

In some embodiments, a first supply voltage may be applied to the odd-numbered power mesh lines and a second supply voltage may be applied to the even-numbered power mesh lines. For example, in the integrated circuit 90 of FIG. 9, the positive supply voltage VDD may be applied to the first power mesh line PM91 and the third power mesh line PM93, while the negative supply voltage VSS is applied to the second power mesh line PM92 and the fourth power mesh line PM94. Accordingly, the odd-numbered power mesh lines (for example, the first and third power mesh lines PM91 and PM93) may be connected to the first power line PL91 and the second power line PL92 to which the positive supply voltage VDD is applied via the vias V2, while the even-numbered power lines (for example, the second and fourth power mesh lines PM92 and PM94) may be connected to the third power line PL93 and the fourth power line PL94 to which the negative supply voltage VSS is applied via the vias V2. As such, supply voltages may be applied to power mesh lines of the power mesh, and the second power line PL92 included in the third cell C93, which is the multiple height cell, may be connected to at least one power mesh line by conductive vias V2, and as a result, the positive supply voltage may be stably supplied to the second power line PL92 in the third cell C93.

Figure 10:
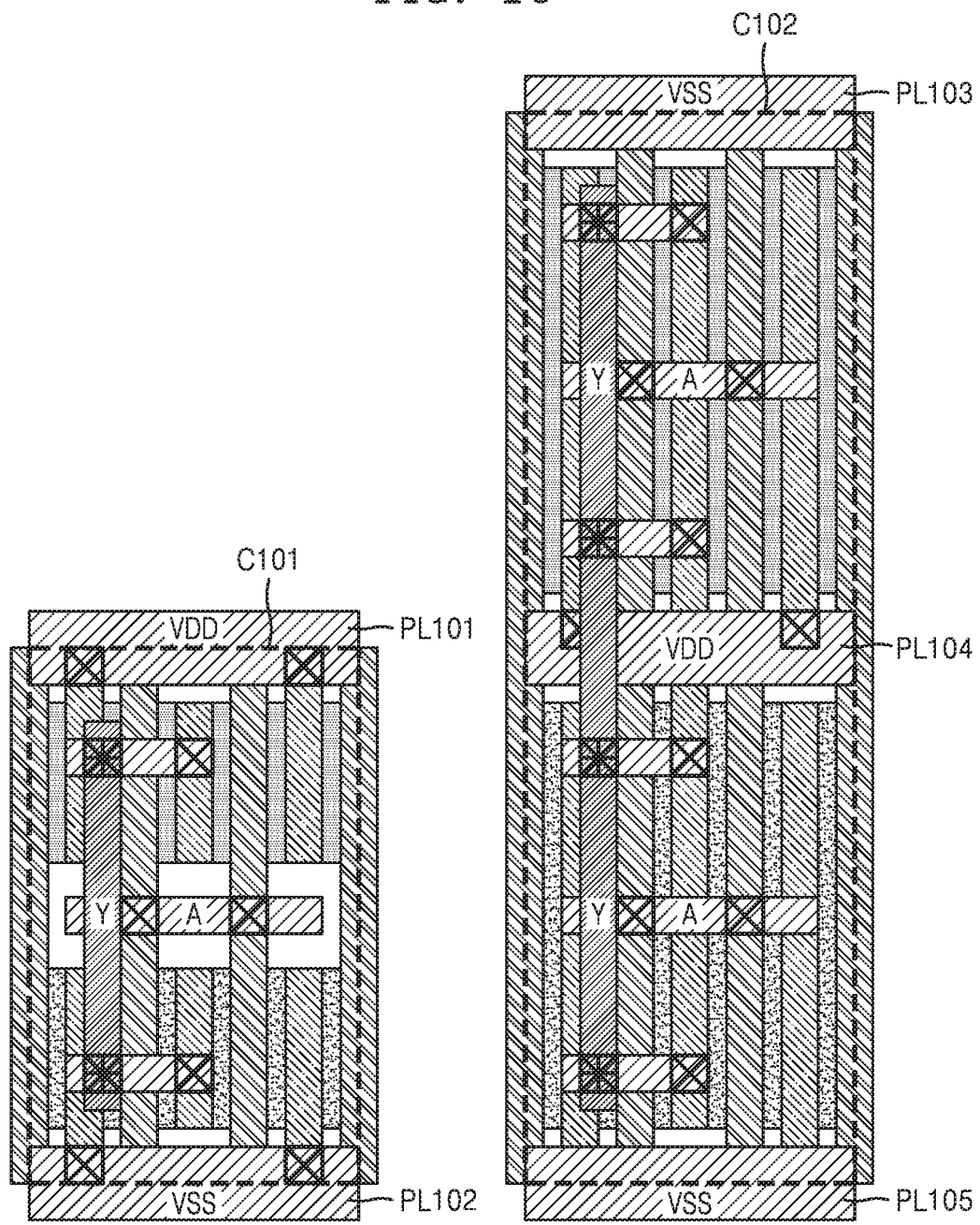
FIG. 10 illustrates plan views of cells according to some embodiments.

FIG. 10 illustrates plan views of a first cell C101 and a second cell C102 according to some embodiments. FIG. 10 illustrates a multiple height cell which provides the same function and includes the same pattern as a single height cell.

The first cell C101 may function as an inverter including the input pin A and the output pin Y, and may receive the positive supply voltage VDD and the negative supply voltage VSS from a first power line PL101 and the second power line PL102 which extend in the X-axis direction at a boundary of the first cell C101, respectively.

When it is possible to form a contact connected to a gate, that is, a gate contact in the active region, the multiple height cell may include at least some of the same structure as the single height cell and may include a power line crossing the multiple height cell as the power line of the single height cell extends. For example, as illustrated in FIG. 10, the second cell C102 may be supplied with the negative supply voltage VSS from a third power line PL103 and a fifth power line PL105, and a fourth power line PL104, which provides the positive supply voltage VDD, may extend in the X-axis direction across the second cell C102. In addition, patterns of the M1 layer formed between the third power line PL103 and the fourth power line PL104 may be identical to patterns of the M1 layer of the first cell C101, and patterns of the M1 layer formed between the fourth power line PL104 and the fifth power line PL105 may also be identical to the patterns of the M1 layer of the first cell C101.

Figure 11:
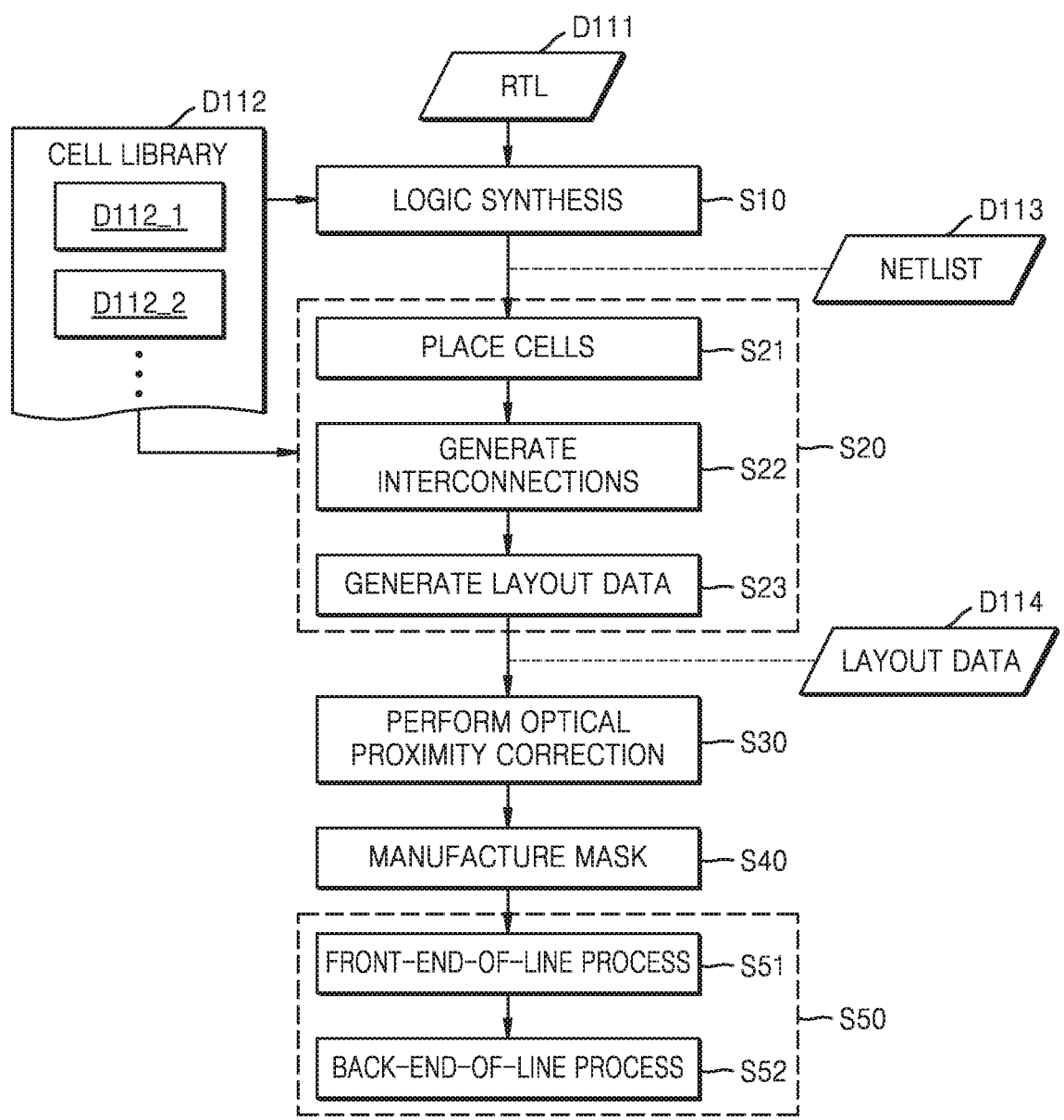
FIG. 11 is a flowchart for explaining a method of manufacturing an integrated circuit according to some embodiments.

FIG. 11 is a flowchart for explaining methods of manufacturing an integrated circuit according to some embodiments.

A cell library (or a standard cell library) D112 may include information about cells, for example, function information, characteristic information, layout information, and the like. As illustrated in FIG. 11, the cell library D112 may include data (a first data D112_1, a second data D112_2, etc.) defining the layout of the multiple height cell. In some embodiments, for cells providing the same function and performance, the first data D112_1 may define a layout of cells, such as the first cell C31 and the second cell C32 in FIG. 3, which are arranged between the power lines to which the negative supply voltage VSS is applied and include the power line to which the positive supply voltage VDD is applied, while the second data D112_2 defines a layout of cells, such as the third cell C33 and the fourth cell C34 in FIG. 3, which are arranged between the power lines to which the positive supply voltage VDD is applied and include the power line to which the negative supply voltage VSS is applied. In addition, the cell library D112 may define an interface cell for connecting a multiple height cell to a single height cell.

A logic synthesis operation of generating netlist data D113 from register-transfer level (RTL) data D111 may be performed (S10). For example, a semiconductor design tool (for example, a logic synthesis tool) may generate netlist data D113 including a bitstream or a netlist by performing a logic synthesis with reference to the cell library D112, from the RTL data D111, which is written in hardware description language (HDL) such as very-high-speed integrated circuits (VHSIC) HDL (VHDL) and Verilog. The cell library D112 may include information defining the multiple height cells which provide good performance due to extended active regions, and accordingly, the multiple height cells may be included in an integrated circuit with reference to the included information in a logic synthesis process.

A placement and routing (P&R) operation of generating layout data D114 from the netlist data D113 may be performed (S20). As illustrated in FIG. 11, the P&R operation S20 may include a plurality of operations S21, S22, and S23.

An operation of placing cells may be performed (S21). For example, the semiconductor design tool (for example, a P&R tool) may place a plurality of cells with reference to the cell library D112 from the netlist data D113. As described above, the semiconductor design tool may place the single height cells and the multiple height cells.

An operation of generating the interconnections may be performed (S22). The interconnections may electrically connect the output pins and the input pins of cells and may include, for example, at least one via and at least one conductive pattern. In addition, as described above with reference to FIGS. 8A, 8B, and 9, the power lines and the power mesh lines may be generated, and vias to connect them may be generated. As described above, the multiple height cells may provide the input pins and the output pins of wide area, and accordingly, the routing may be easily performed, and signal delays occurring at the interconnections may be reduced by simplification of the generated interconnections.

An operation of generating the layout data D114 may be performed (S23). The layout data D114 may have a format such as graphic database system information interchange (GDSII) and may include geometric information about the cells and the interconnections.

An operation of optical proximity correction (OPC) may be performed (S30). The OPC may refer to a work for forming a pattern of a shape by correcting distortion phenomena such as refraction due to light characteristics in photolithography included in a semiconductor process of manufacturing an integrated circuit, and a pattern on a mask may be determined by applying the OPC to the layout data D114. In some embodiments, the layout of the integrated circuit may be modified in operation S30, and a limited modification of the integrated circuit in operation S30 may be a post-process for improving or optimizing a structure of the integrated circuit and may be referred to as a design polishing.

An operation of manufacturing the mask may be performed (S40). For example, patterns on the mask may be defined to form patterns formed on a plurality of layers by applying the OPC to the layout data D114, and at least one mask (or a photomask) for forming the patterns of each of the plurality of layers may be manufactured.

An operation of fabricating the integrated circuit may be performed (S50). For example, the integrated circuit may be fabricated by patterning the plurality of layers by using the at least one mask manufactured in operation S40. As illustrated in FIG. 11, the operation S50 may include operations S51 and S52.

A front-end-of-line (FEOL) process may be performed (S51). The FEOL process may be referred to as a process of forming individual elements such as transistors, capacitors, and resistors on a substrate in an integrated circuit manufacturing process. For example, the FEOL process may include planarizing and cleaning a wafer, forming a trench, forming a well, forming a gate line, forming a source and a drain, and the like.

A back-end-of-line (BEOL) process may be performed (S52). The BEOL process may be referred to as a process of interconnecting individual elements such as transistors, capacitors, and resistors in the integrated circuit manufacturing process. For example, the BEOL process may include silicidating gate, source, and drain regions, adding dielectric, planarizing, forming holes, adding metal layers, forming vias, forming passivation layers, and the like. The integrated circuit may be packaged in a semiconductor package and may be used as a product for various applications.

Figure 12:
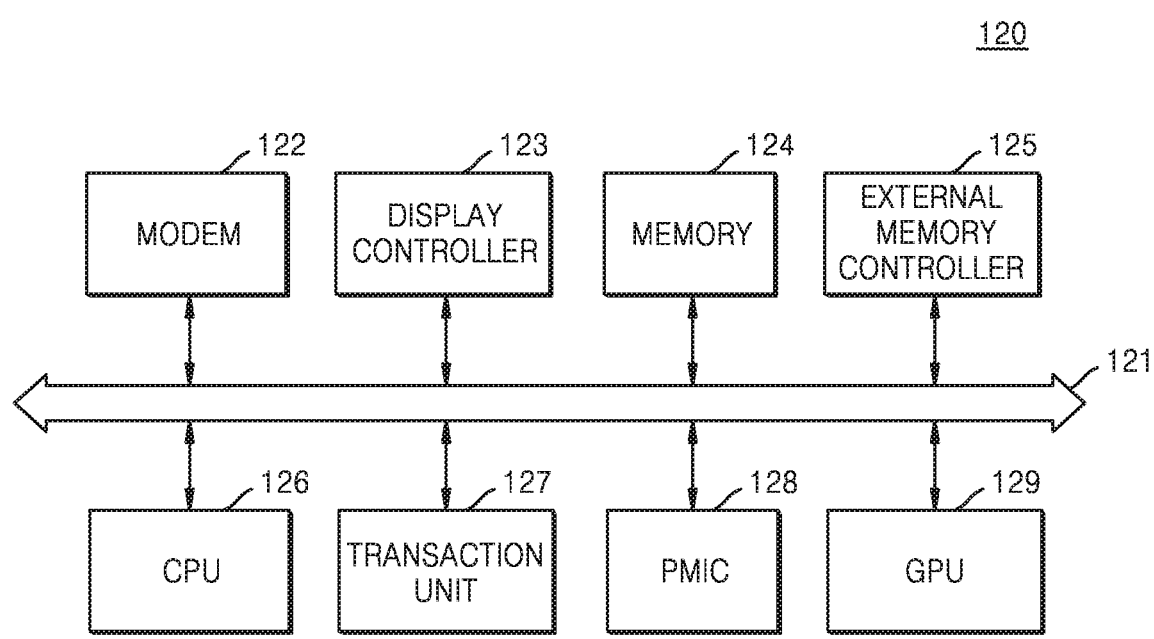
FIG. 12 is a block diagram illustrating a system on chip (SoC) according to some embodiments.

FIG. 12 is a block diagram illustrating a system on chip (SoC) 120 according to some embodiments. The SoC 120 may be a semiconductor device and may include an integrated circuit according to some embodiments. The SoC 120 may be a one-chip implementation of complex function blocks such as intellectual property (IP) performing various functions, wherein the multiple height cells according to some embodiments of the inventive concepts are included in each function block of the SoC 120, and thus, the SoC 120 providing improved space efficiency and performance may be obtained.

Referring to FIG. 12, the SoC 120 may include a modem 122, a display controller 123, a memory 124, an external memory controller 125, a central processing unit (CPU) 126, a transaction unit 127, a power management integrated circuit (PMIC) 128, and a graphic processing unit (GPU) 129, and each function block of the SoC 120 may communicate with each another via a system bus 121.

The CPU 126 capable of controlling an overall operation of the SoC 120 may control the operations of other function blocks (122, 123, 124, 125, 127, 128, and 129). The modem 122 may demodulate a signal received from the outside of the SoC 120, or may modulate a signal generated in the SoC 120 and transmit the modulated signal to the outside (e.g., to an external device). The external memory controller 125 may control an operation of sending and receiving data to and from an external memory device connected to the SoC 120. For example, programs and/or data stored in the external memory device may be provided to the CPU 126 or the GPU 129 under the control of the external memory controller 125. The GPU 129 may execute program instructions related to graphics processing. The GPU 129 may receive graphic data via the external memory controller 125 and may transmit graphic data processed by the GPU 129 to the outside of the SoC 120 via the external memory controller 125. The transaction unit 127 may monitor data transaction of each function block, and the PMIC 128 may control power supplied to each function block under the control of the transaction unit 127. The display controller 123 may transmit data generated inside the SoC 120 to a display by controlling the display (or a display device) outside the SoC 120.

The memory 124 may include a nonvolatile memory such as an electrically erasable programmable read-only memory (ROM) (EEPROM), a flash memory, phase change random access memory (RAM) (PRAM), resistance RAM (RRAM), nano floating gate memory (NFGM), polymer RAM (PoRAM), magnetic RAM (MRAM), and ferroelectric RAM (FRAM), and a volatile memory such as dynamic RAM (DRAM), static RAM (SRAM), a mobile DRAM, double data rate (DDR) synchronous DRAM (DDR SDRAM), low power DDR (LPDDR) SDRAM, graphic DDR (GDDR) SDRAM, and/or rambus DRAM (RDRAM).

Figure 13:
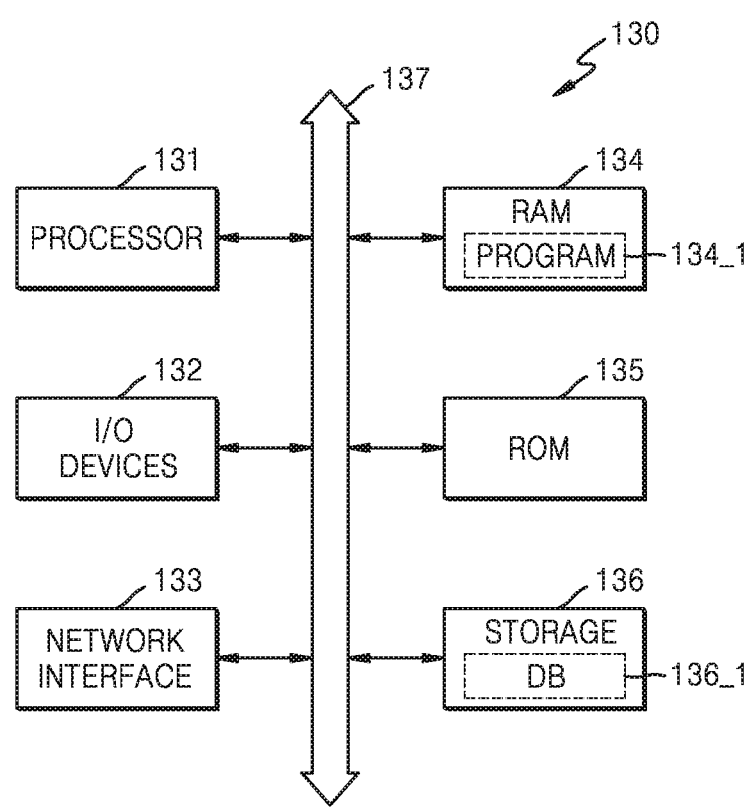
FIG. 13 is a block diagram illustrating a computing system including a memory for storing a program according to some embodiments.

FIG. 13 is a block diagram illustrating a computing system 130 including a memory for storing a program according to some embodiments. At least some of the operations included in a method for manufacturing the integrated circuit (for example, the method of FIG. 11) according to some embodiments of the inventive concepts may be performed in the computing system 130.

The computing system 130 may be a fixed computing system such as a desktop computer, a workstation, and a server, or a portable computing system such as a laptop computer. As illustrated in FIG. 13, the computing system 130 may include a processor 131, input/output devices 132, a network interface 133, a RAM 134, a ROM 135, and a storage device 136. The processor 131, the input/output devices 132, the network interface 133, the RAM 134, the ROM 135, and the storage device 136 may be connected to a bus 137, and may communicate with each other via the bus 137.

The processor 131 may be referred to as a processing unit, and may include at least one core such as a micro-processor, an application processor (AP), a digital signal processor (DSP), and a graphics processing unit (GPU), which are capable of executing a variety of sets of instructions (for example, Intel Architecture-32 (IA-32)), 64-bit extensions to IA-32, x86-64, PowerPC, scalable processor architecture (SPARC), microprocessor without interlocked pipeline stages (MIPS), Acorn reduced instruction set computer machine (ARM), Intel Architecture-64 (IA-64), etc.). For example, the processor 131 may access a memory, that is, the RAM 134 or the ROM 135, via the bus 137, and may execute instructions stored in the RAM 134 or the ROM 135.

The RAM 134 may store a program 134_1 for fabricating the integrated circuit according to some embodiments or at least a portion thereof, and the program 134_1 may cause the processor 131 to perform at least some of the operations included in a method of fabricating the integrated circuit (for example, the method of FIG. 11). In other words, the program 134_1 may include a plurality of instructions executable by the processor 131, and the plurality of instructions included in the program 134_1 may cause the processor 131 to perform at least some of the operations included in the flowchart described above with reference to FIG. 11.

The storage device 136 may not lose stored data even when power supplied to the computing system 130 is interrupted. For example, the storage device 136 may include the nonvolatile memory device and may include a storage medium such as a magnetic tape, an optical disk, and/or a magnetic disk. In addition, the storage device 136 may be removable from the computing system 130. The storage device 136 may store the program 134_1 in accordance with some embodiments, and before the program 134_1 is executed by the processor 131, the program 134_1 or at least a portion thereof may be loaded from the storage device 136 into the RAM 134. Alternatively, the storage device 136 may store a file written in a programming language, and the program 134_1 generated by a compiler or the like from the file or at least a portion thereof may be loaded into the RAM 134. In addition, as illustrated in FIG. 13, the storage device 136 may store a database 136_1, and the database 136_1 may include information needed for designing the integrated circuit, for example, the cell library D112 in FIG. 11.

The storage device 136 may store data to be processed by the processor 131 or data already processed by the processor 131. In other words, the processor 131, in accordance with the program 134_1, may generate data by processing data stored in the storage device 136, and may store the generated data in the storage device 136. For example, the storage device 136 may store the RTL data D111, the netlist data D113, and/or the layout data D114 in FIG. 11.

The input/output devices 132 may include input devices such as keyboards and/or pointing devices, and may include output devices such as display devices and/or printers. For example, a user may trigger an execution of the program 134_1 by the processor 131 via the input/output devices 132, and may input the RTL data D111 and/or the netlist data D113 in FIG. 11 or identify the layout data D114 in FIG. 11.

The network interface 133 may provide an access to a network outside the computing system 130. For example, the network may include multiple computing systems and communication links, and the communication links may include wired links, optical links, wireless links, or any other types of links.

As described above, embodiments have been disclosed in the drawings and specification. Spatially relative terms, such as "beneath," "under," "over," "below," "above," "lower," "upper," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" can encompass both an orientation of above and below. The device may be otherwise oriented (rotated 90 degrees or at other orientations), and the spatially relative descriptors used herein may be interpreted accordingly. While embodiments have been described herein with reference to specific terms, it should be understood that they have been used only for the purpose of describing the technical idea of the inventive concepts and not for limiting the scope of the inventive concepts as defined in the claims. Therefore, it will be clearly understood by one of ordinary skill in the art that various modifications and equivalent embodiments are possible without departing from the scope of the inven-

What is claimed is:

1. An integrated circuit comprising:
a first cell in a first row extending in a first horizontal direction;
a second cell in a second row extending in the first horizontal direction adjacent to the first row; and
a third cell continuously extending in the first row and the second row,
wherein the first cell and the second cell comprise respective portions of a first power line extending in the first horizontal direction,
wherein the third cell comprises a second power line electrically connected to the first power line and extending in the first horizontal direction in the first row, and wherein a portion of the third cell in the second row is free of the second power line,
wherein the first cell and the third cell comprise respective portions of a third power line extending in the first horizontal direction, and the second cell and the third cell comprise respective portions of a fourth power line extending in the first horizontal direction.

2. The integrated circuit of claim 1, further comprising an interface cell comprising an interconnection continuously extending in the first row and the second row adjacent to the third cell and connecting the first power line to the second power line,
wherein the interconnection comprises at least a portion thereof extending in a second horizontal direction perpendicular to the first horizontal direction.

3. The integrated circuit of claim 2, wherein the at least the portion of the interconnection comprises at least one of a contact, a gate line, or a metal pattern extending in the second horizontal direction.

4. The integrated circuit of claim 1, wherein the first cell and the third cell are arranged adjacent to each other and share a gate line extending in a second horizontal direction perpendicular to the first horizontal direction at a boundary between the first cell and the third cell, the gate line being electrically connected to the first power line and the second power line.

5. The integrated circuit of claim 1, wherein the first power line and the second power line are configured to be applied with a first supply voltage, and the third power line and the fourth power line are configured to be applied with a second supply voltage.

6. The integrated circuit of claim 1, wherein the third cell comprises at least one of a transistor, an input pin, or an output pin between the second power line and the respective portion of the fourth power line.

7. The integrated circuit of claim 1, wherein the third cell comprises a first active region of a first conductivity type and a second active region of a second conductivity type extending parallel to each other in the first horizontal direction, wherein the first active region comprises at least a portion thereof in the first row and the second active region comprises at least a portion thereof in the second row.

8. The integrated circuit of claim 7, further comprising an interface cell continuously extending in the first row and the second row between the first cell and the third cell, and between the second cell and the third cell,
wherein, in the interface cell, the first active region of the third cell and an active region of the second conductivity type comprised in the first cell are separated from each other in the first horizontal direction, and the second active region of the third cell and an active region of the first conductivity type comprised in the second cell are separated from each other in the first horizontal direction.

9. The integrated circuit of claim 7, further comprising an interface cell continuously extending in the first row and the second row between the first cell and the third cell, and between the second cell and the third cell,
wherein the interface cell comprises at least one of a third active region or a fourth active region,
wherein the third active region connects the first active region to an active region of the first conductivity type comprised in the first cell
wherein the fourth active region connects the second active region to an active region of the second conductivity type comprised in the second cell.

10. The integrated circuit of claim 1, further comprising:
a first upper power line electrically connected to the first power line, the first upper power line extending in the first horizontal direction over the first power line; and
a second upper power line electrically connected to the second power line, the second upper power line extending in the first horizontal direction over the second power line.

11. The integrated circuit of claim 10, wherein the first upper power line extends in the first horizontal direction across the third cell.

12. The integrated circuit of claim 10, further comprising power mesh lines extending in a second horizontal direction perpendicular to the first horizontal direction over the first upper power line and the second upper power line,
wherein the power mesh lines comprise odd-numbered power mesh lines electrically connected to the first upper power line and even-numbered power mesh lines electrically connected to the second upper power line.

13. The integrated circuit of claim 1, wherein the second power line has a dimension in a second horizontal direction that is equal to a dimension of the first power line in the second horizontal direction, the second horizontal direction being perpendicular to the first horizontal direction.

14. An integrated circuit comprising:
a first cell in a first row extending in a first horizontal direction;
a second cell in a second row extending in the first horizontal direction adjacent to the first row;
a third cell continuously extending in the first row and the second row, wherein the third cell comprises a first active region of a first conductivity type and a second active region of a second conductivity type extending parallel to each other in the first horizontal direction, and wherein the first active region comprises at least a portion thereof in the first row, and the second active region comprises at least a portion thereof in the second row; and
an interface cell continuously extending in the first row and the second row between the first cell and the third cell, and between the second cell and the third cell,
wherein, in the interface cell, the first active region of the third cell and an active region of the second conductivity type comprised in the first cell are separated from each other in the first horizontal direction, and the second active region of the third cell and an active region of the first conductivity type comprised in the second cell are separated from each other in the first horizontal direction.

15. The integrated circuit of claim 14, wherein the first cell and the second cell comprise respective portions of a first power line extending in the first horizontal direction, and the third cell comprises a second power line electrically connected to the first power line and extending in the first horizontal direction in the first row, and wherein the second row is free of the second power line.

16. An integrated circuit comprising:
a first cell in a first row extending in a first horizontal direction;
a second cell in a second row extending in the first horizontal direction adjacent to the first row;
a third cell continuously extending in the first row and the second row, wherein the third cell comprises a first active region of a first conductivity type and a second active region of a second conductivity type extending parallel to each other in the first horizontal direction, and wherein the first active region comprises at least a portion thereof in the first row, and the second active region comprises at least a portion thereof in the second row; and
an interface cell continuously extending in the first row and the second row between the first cell and the third cell, and between the second cell and the third cell,
wherein the interface cell comprises at least one of a third active region or a fourth active region,
wherein the third active region connects the first active region and an active region of the first conductivity type comprised in the first cell, and
wherein the fourth active region connects the second active region and an active region of the second conductivity type comprised in the second cell.

* * * * *